(12) United States Patent
Oka et al.

(10) Patent No.: US 7,829,257 B2
(45) Date of Patent: *Nov. 9, 2010

(54) PHOTOSENSITIVE RESIN COMPOSITION

(75) Inventors: Hidetaka Oka, Takarazuka (JP); Kazuhiko Kunimoto, Takatsuki (JP); Hisatoshi Kura, Hyogo (JP); Masaki Ohwa, Kobe (JP); Junichi Tanabe, Takarazuka (JP)

(73) Assignee: Ciba Specialty Chemicals Corp., Tarrytown, NY (US)

(*) Notice: Subject to any disclaimer, the term of this patent is extended or adjusted under 35 U.S.C. 154(b) by 292 days.

This patent is subject to a terminal disclaimer.

(21) Appl. No.: 09/734,635

(22) Filed: Dec. 12, 2000

(65) Prior Publication Data

US 2002/0020832 A1    Feb. 21, 2002

(30) Foreign Application Priority Data

Dec. 15, 1999 (EP) .................. 99811161
Jul. 17, 2000 (EP) .................. 00810630

(51) Int. Cl.
 *G03C 1/00* (2006.01)
(52) U.S. Cl. ............... 430/270.1; 430/280.1; 430/281.1; 430/286.1; 430/311
(58) Field of Classification Search ............... 430/270.1, 430/281.1, 286.1, 320, 321, 322; 522/8; 622/33
See application file for complete search history.

(56) References Cited

U.S. PATENT DOCUMENTS

| | | | | |
|---|---|---|---|---|
| 3,558,309 A | * | 1/1971 | Laridon et al. | 430/281.1 |
| 4,202,697 A | | 5/1980 | Van Goethem et al. | 430/306 |
| 4,255,513 A | | 3/1981 | Laridon et al. | 430/281 |
| 4,282,309 A | * | 8/1981 | Laridon et al. | 430/281.1 |
| 4,499,180 A | * | 2/1985 | Hirai et al. | 430/559 |
| 4,590,145 A | | 5/1986 | Itoh et al. | 430/281 |
| 4,670,373 A | * | 6/1987 | Kitaguchi et al. | 430/353 |
| 5,019,482 A | | 5/1991 | Ai et al. | 430/283 |
| 5,104,770 A | * | 4/1992 | Usifer et al. | 430/270.1 |
| 5,180,652 A | | 1/1993 | Yamaguchi et al. | 430/281 |
| 5,399,450 A | * | 3/1995 | Matsushima et al. | 430/7 |
| 5,703,140 A | | 12/1997 | Kunita et al. | 522/57 |
| 5,849,857 A | * | 12/1998 | Awaji et al. | 528/98 |
| 6,057,380 A | * | 5/2000 | Birbaum et al. | 522/8 |
| 2001/0012596 A1 | | 8/2001 | Kunimoto et al. | 430/138 |

FOREIGN PATENT DOCUMENTS

| | | |
|---|---|---|
| EP | 0014012 | 8/1980 |
| EP | 0332158 | 9/1989 |
| GB | 2029423 | 3/1980 |
| GB | 2178047 | 2/1987 |
| GB | 2339571 | 2/2000 |
| GB | 2348644 | 10/2000 |
| JP | 59-229553 | 12/1984 |
| JP | 8272095 | 10/1996 |
| JP | 8339081 | 12/1996 |
| WO | 00/00869 | 1/2000 |
| WO | 00/52530 | 9/2000 |

OTHER PUBLICATIONS

JAPIO Accession No. 1996-272095 for JP 08272095; Chem. Abstr. 126:52861 for JP 08272095 and Derwent Abstr.1997-003129 for JP 08272095.
JAIPO Accession No. 1996-339081 for JP 08339081, Chem. Abstr. 126:205478 for JP 08339081 and Derwent Abstr. 1997-104947 for JP 08339081.
Derwent Abstract 1985-035144 [06] for JP 59229553 (1984).
Research Disclosure, Sep. 2000, No. 437, pp. 1572-1573, "Use of ketoxime-esters".
Patent Abstracts of Japan Publication No. 07-140658 (1995).
Patent Abstracts of Japan Publication No. 60-076738 (1985).
Patent Abstracts of Japan Publication No. 06-324492 (1994).
Patent Abstracts of Japan 62273259 Publication Date Nov. 27, 1987.
Patent Abstracts of Japan 62184056 Publication Date Aug. 12, 1987.

* cited by examiner

*Primary Examiner*—Cynthia H Kelly
*Assistant Examiner*—Chanceity N Robinson
(74) *Attorney, Agent, or Firm*—Tyler A. Stevenson

(57) ABSTRACT

Photosensitive compositions comprising
(A) an alkali soluble compound;
(B) at least one compound, of formula I or II

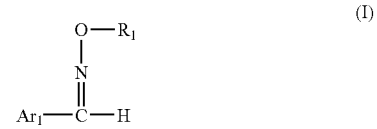

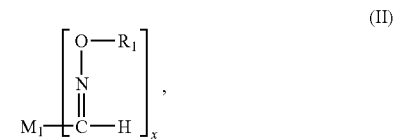

wherein
$R_1$ inter alia is $C_4$-$C_9$cycloalkanoyl, $C_3$-$C_{12}$alkenoyl, or benzoyl which is unsubstituted or substituted; $Ar_1$ is either $C_6$-$C_{20}$aryl or $C_6$-$C_{20}$aryloyl each of which is unsubstituted or substituted; x is 2 or 3; $M_1$ when x is 2, inter alia is a group phenylene or naphthylene, each of which optionally is substituted i.a. by $OR_3$, $SR_4$ or $NR_5R_6$; or $M_1$, when x is 3, is a trivalent group, optionally substituted; $R_3$ is for example hydrogen or $C_1$-$C_{12}$alkyl; $C_2$-$C_6$alkyl which is for example substituted by —OH, —SH, —CN, $C_3$-$C_6$alkenoxy, or —OCH$_2$CH$_2$CN; $R_4$ is for example hydrogen, $C_1$-$C_{12}$alkyl, $C_3$-$C_{12}$alkenyl, cyclohexyl, or phenyl which is unsubstituted or substituted; $R_5$ and $R_6$ independently of each other inter alia are hydrogen, $C_1$-$C_{12}$alkyl, $C_2$-$C_4$hydroxyalkyl, $C_2$-$C_{10}$alkoxyalkyl, $C_3$-$C_5$alkenyl, $C_3$-$C_8$cycloalkyl, phenyl-$C_1$-$C_3$alkyl, $C_1$-$C_4$alkanoyl, $C_3$-$C_6$alkenoyl, benzoyl or phenyl which is unsubstituted or substituted; and
(C) a photopolymerizable compound;
exhibit an unexpectedly good performance, in particular in photoresist technology.

11 Claims, No Drawings

PHOTOSENSITIVE RESIN COMPOSITION

The invention pertains to photosensitive compositions which can be developed by alkali, comprising oxime ester compounds as photoinitiators.

From U.S. Pat. Nos. 3,558,309, 4,202,697, 4,255,513, 4,590,145 it is known that oxime ester derivatives are photoinitiators. In JP Kokai Hei 8-272095 solder resist ink compositions comprising inter alia 1-phenyl-1,2-propanedione-2-O-benzoyl oxime and 1-phenyl-1,2-propanedione-2-O-ethoxycarbonyl oxime as photoinitiators are disclosed. In JP Kokai Hei 8-339081 in a similar composition 1-phenyl-1,2-propanedione-2-O-ethoxycarbonyl oxime is employed.

In photopolymerization technology there still exists a need for compositions suitable in particular as imaging formulations which are reactive, alkaline developable, easy to handle, exhibit good resolution properties and meet the high requirements of the industry regarding properties like, for example, thermal stability and storage stability.

Surprisingly it was found, that alkaline developable photosensitive compositions, comprising 1. Alkaline developable, photosensitive composition comprising
   (A) at least one alkaline soluble binder resin, prepolymer or monomer component;
   (B) at least one compound of formula I or II

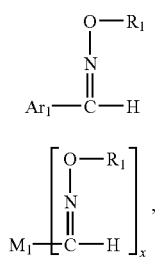

wherein $R_1$ is $C_4$-$C_9$cycloalkanoyl, $C_3$-$C_{12}$alkenoyl; $C_1$-$C_{20}$alkanoyl which is unsubstituted or substituted by one or more halogen, CN or phenyl; or $R_1$ is benzoyl which is unsubstituted or substituted by one or more $C_1$-$C_6$alkyl, halogen, CN, $OR_3$, $SR_4$ or $NR_5R_6$; or $R_1$ is $C_2$-$C_{12}$alkoxycarbonyl or benzyloxycarbonyl; or phenoxycarbonyl which is unsubstituted or substituted by one or more $C_1$-$C_6$alkyl or halogen;

$Ar_1$ is $C_6$-$C_{20}$aryl or $C_6$-$C_{20}$aryloyl, both radicals are unsubstituted or substituted 1 to 12 times by halogen, $C_1$-$C_{20}$alkyl, benzyl, $C_1$-$C_{20}$alkanoyl, $C_3$-$C_8$cycloalkyl; or said $C_6$-$C_{20}$aryl or $C_6$-$C_{20}$aryloyl is substituted by phenyl or benzoyl each of which optionally is substituted by one or more $OR_3$, $SR_4$ or $NR_5R_6$; or said $C_6$-$C_{20}$aryl or $C_6$-$C_{20}$aryloyl is substituted by $C_2$-$C_{12}$alkoxycarbonyl optionally interrupted by one or more —O— and/or optionally substituted by one or more hydroxyl groups; or said $C_6$-$C_{20}$aryl or $C_6$-$C_{20}$aryloyl is substituted by phenoxycarbonyl, $OR_3$, $SR_4$, $SOR_4$, $SO_2R_4$ or $NR_5R_6$, wherein the substituents $OR_3$, $SR_4$ or $NR_5R_6$ optionally form 5- or 6-membered rings via the radicals $R_3$, $R_4$, $R_5$ and/or $R_6$ with further substituents on the aryl ring of the $C_6$-$C_{20}$aryl or $C_6$-$C_{20}$aryloyl group or with one of the carbon atoms of the aryl ring of the $C_6$-$C_{20}$aryl or $C_6$-$C_{20}$aryloyl group;

or $Ar_1$ is $C_3$-$C_9$heteroaryl, provided that $R_1$ is acetyl, said $C_3$-$C_9$heteroaryl is unsubstituted or substituted 1 to 7 times by halogen, $C_1$-$C_{20}$alkyl, benzyl, $C_1$-$C_{20}$alkanoyl, or $C_3$-$C_8$cycloalkyl; or said $C_3$-$C_9$heteroaryl is substituted by phenyl or benzoyl, each of which optionally is substituted by one or more $OR_3$, $SR_4$ or $NR_5R_6$; or said $C_3$-$C_9$heteroaryl is substituted by $C_2$-$C_{12}$alkoxycarbonyl optionally interrupted by one or more —O— and/or optionally substituted by one or more hydroxyl groups; or said $C_6$-$C_{20}$aryl or $C_6$-$C_{20}$aryloyl is substituted by phenoxycarbonyl, $OR_3$, $SR_4$, $SOR_4$, $SO_2R_4$ or $NR_5R_6$;

x is 2 or 3;

$M_1$ when x is 2, is

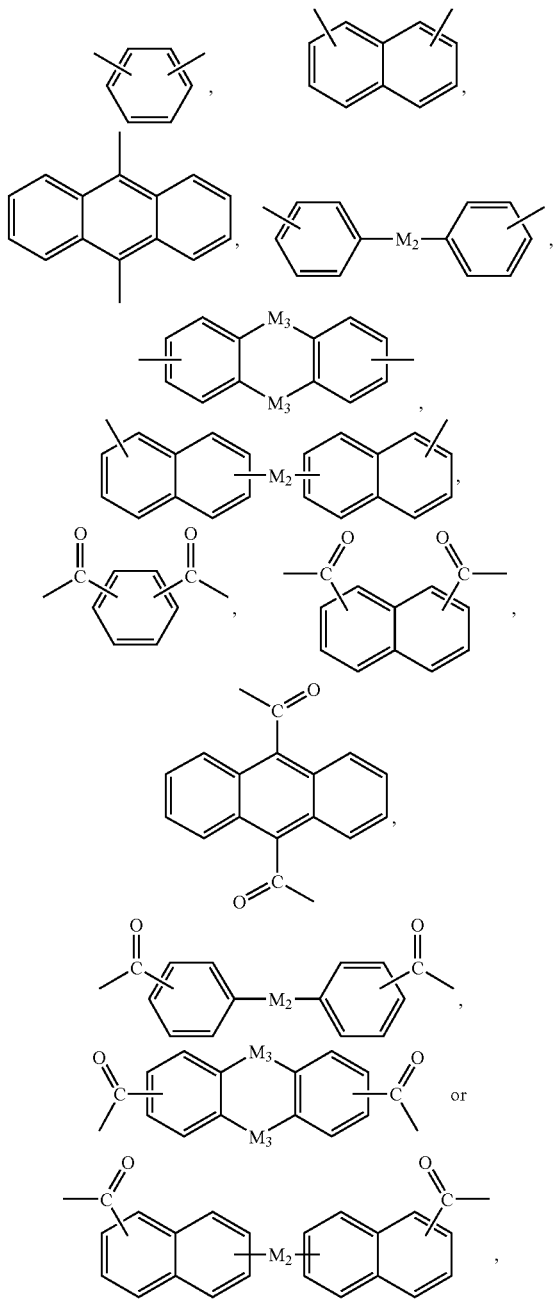

each of which optionally is substituted 1 to 12 times by halogen, $C_1$-$C_{12}$alkyl, $C_3$-$C_8$cycloalkyl, benzyl; phenyl which is unsubstituted or substituted by one or more $OR_3$, SR$_4$ or NR$_5$R$_6$; benzoyl which is unsubstituted or substituted by one or more OR$_3$, SR$_4$ or NR$_5$R$_6$; C$_1$-C$_{12}$alkanoyl; C$_2$-C$_{12}$alkoxycarbonyl optionally interrupted by one or more —O— and/or optionally substituted by one or more OH, phenoxycarbonyl, OR$_3$, SR$_4$, SOR$_4$, SO$_2$R$_4$ or NR$_5$R$_6$;

or M$_1$, when x is 3, is

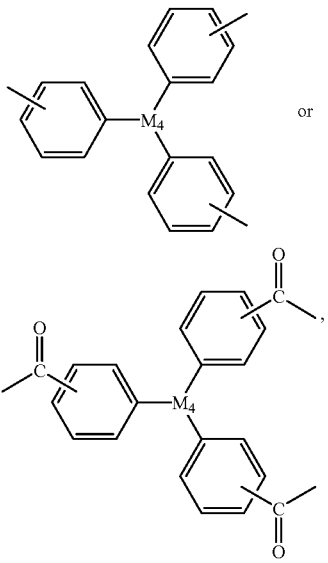

each of which optionally is substituted 1 to 12 times by halogen, C$_1$-C$_{12}$alkyl, C$_3$-C$_8$cycloalkyl; phenyl which is unsubstituted or substituted by one or more OR$_3$, SR$_4$ or NR$_5$R$_6$; benzyl, benzoyl, C$_1$-C$_{12}$alkanoyl; C$_2$-C$_{12}$alkoxycarbonyl optionally interrupted by one or more —O— and/or optionally substituted by one or more hydroxyl groups, phenoxycarbonyl, OR$_3$, SR$_4$, SOR$_4$, SO$_2$R$_4$ or NR$_5$R$_6$;

M$_2$ is a direct bond, —O—, —S—, —SS—, —NR$_3$—, —(CO)—, C$_1$-C$_{12}$alkylene, cyclohexylene, phenylene, naphthylene, —(CO)O—(C$_2$-C$_{12}$alkylene)-O(CO)—, —(CO)O—(CH$_2$CH$_2$O)$_n$—(CO)— or —(CO)—(C$_2$-C$_{12}$-alkylene)-(CO)—; or M$_2$ is C$_4$-C$_{12}$alkylene or C$_4$-C$_{12}$alkylenedioxy-, each of which is optionally interrupted by 1 to 5 —O—, —S— and/or —NR$_3$—;

M$_3$ is a direct bond, —CH$_2$—, —O—, —S—, —SS—, —NR$_3$— or —(CO)—;

M$_4$ is

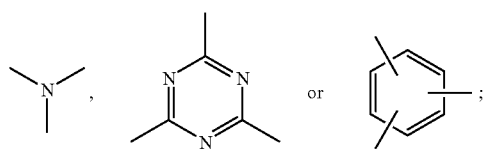

R$_3$ is hydrogen or C$_1$-C$_{20}$alkyl; or R$_3$ is C$_2$-C$_{12}$alkyl which is substituted by —OH, —SH, —CN, C$_3$-C$_6$alkenoxy, —OCH$_2$CH$_2$CN, —OCH$_2$CH$_2$(CO)O(C$_1$-C$_4$alkyl), —O(CO)—C$_1$-C$_4$alkyl, —O(CO)-phenyl, —(CO)OH, —(CO)O(C$_1$-C$_4$alkyl), —N(C$_1$-C$_4$alkyl)$_2$, —N(CH$_2$CH$_2$OH)$_2$, —N[CH$_2$CH$_2$O—(CO)—C$_1$-C$_4$alkyl]$_2$ or morpholinyl; or R$_3$ is C$_2$-C$_{12}$alkyl which is interrupted by one or more —O—; or R$_3$ is —(CH$_2$CH$_2$O)$_{n+1}$H, —(CH$_2$CH$_2$O)$_n$(CO)—C$_1$-C$_8$alkyl, C$_1$-C$_8$alkanoyl, C$_3$-C$_{12}$alkenyl, C$_3$-C$_6$alkenoyl, C$_3$-C$_8$cycloalkyl; or R$_3$ is benzoyl which is unsubstituted or substituted by one or more C$_1$-C$_6$alkyl, halogen, —OH or C$_1$-C$_4$alkoxy; or R$_3$ is phenyl or naphthyl each of which is unsubstituted or substituted by halogen, —OH, C$_1$-C$_{12}$alkyl, C$_1$-C$_{12}$alkoxy, phenyl-C$_1$-C$_3$-alkoxy, phenoxy, C$_1$-C$_{12}$alkylsulfanyl, phenylsulfanyl, —N(C$_1$-C$_{12}$alkyl)$_2$, diphenylamino or —(CO)R$_7$; or R$_3$ is phenyl-C$_1$-C$_3$alkyl, or Si(C$_1$-C$_6$alkyl)$_r$(phenyl)$_{3-r}$;

r is 0, 1, 2 or 3;

n is 1 to 20;

R$_4$ is hydrogen, C$_1$-C$_{20}$alkyl, C$_3$-C$_{12}$alkenyl, C$_3$-C$_8$cycloalkyl, phenyl-C$_1$-C$_3$alkyl; C$_2$-C$_8$alkyl which is substituted by —OH, —SH, —CN, C$_3$-C$_6$alkenoxy, —OCH$_2$CH$_2$CN, —OCH$_2$CH$_2$(CO)O(C$_1$-C$_4$alkyl), —O(CO)—C$_1$-C$_4$alkyl, —O(CO)-phenyl, —(CO)OH or —(CO)O(C$_1$-C$_4$alkyl); or R$_4$ is C$_2$-C$_{12}$alkyl which is interrupted by one or more —O— or —S—; or R$_4$ is —(CH$_2$CH$_2$O)$_{n+1}$H, —(CH$_2$CH$_2$O)$_n$(CO)—C$_1$-C$_8$alkyl, C$_2$-C$_8$alkanoyl, C$_3$-C$_{12}$alkenyl, C$_3$-C$_6$alkenoyl; or R$_4$ is phenyl or naphthyl each of which is unsubstituted or substituted by halogen, C$_1$-C$_{12}$alkyl, C$_1$-C$_{12}$alkoxy or —(CO)R$_7$;

R$_5$ and R$_6$ independently of each other are hydrogen, C$_1$-C$_{20}$alkyl, C$_2$-C$_4$hydroxyalkyl, C$_2$-C$_{10}$alkoxyalkyl, C$_3$-C$_5$alkenyl, C$_3$-C$_8$cycloalkyl, phenyl-C$_1$-C$_3$alkyl, C$_1$-C$_4$alkanoyl, C$_3$-C$_{12}$alkenoyl, benzoyl; or are phenyl or naphthyl each of which is unsubstituted or substituted by C$_1$-C$_{12}$alkyl or C$_1$-C$_{12}$alkoxy; or R$_5$ and R$_6$ together are C$_2$-C$_6$alkylene optionally interrupted by —O— or —NR$_3$— and/or optionally substituted by hydroxyl, C$_1$-C$_4$alkoxy, C$_2$-C$_4$alkanoyloxy or benzoyloxy;

R$_7$ is hydrogen, C$_1$-C$_{20}$alkyl; or is C$_2$-C$_8$alkyl which is substituted by halogen, phenyl, —OH, —SH, —CN, C$_3$-C$_6$alkenoxy, —OCH$_2$CH$_2$CN, —OCH$_2$CH$_2$(CO)O(C$_1$-C$_4$alkyl), —O(CO)—C$_1$-C$_4$alkyl, —O(CO)-phenyl, —(CO)OH or —(CO)O(C$_1$-C$_4$alkyl); or R$_7$ is C$_2$-C$_{12}$alkyl which is interrupted by one or more —O—; or R$_7$ is —(CH$_2$CH$_2$O)$_{n+1}$H, —(CH$_2$CH$_2$O)$_n$(CO)—C$_1$-C$_8$alkyl, C$_3$-C$_{12}$alkenyl, C$_3$-C$_8$cycloalkyl; phenyl optionally substituted by one or more halogen, —OH, C$_1$-C$_{12}$alkyl, C$_1$-C$_{12}$alkoxy, phenoxy, C$_1$-C$_{12}$alkylsulfanyl, phenylsulfanyl, —N(C$_1$-C$_{12}$alkyl)$_2$, or diphenylamino; and a photopolymerizable compound; exhibit an unexpectedly good performance.

C$_1$-C$_{20}$alkyl is linear or branched and is, for example, C$_1$-C$_{18}$-, C$_1$-C$_{14}$-, C$_1$-C$_{12}$-, C$_1$-C$_8$-, C$_1$-C$_6$- or C$_1$-C$_4$alkyl or C$_4$-C$_{12}$- or C$_4$-C$_8$alkyl. Examples are methyl, ethyl, propyl, isopropyl, n-butyl, sec-butyl, isobutyl, tert-butyl, pentyl, hexyl, heptyl, 2,4,4-trimethylpentyl, 2-ethylhexyl, octyl, nonyl, decyl, dodecyl, tetradecyl, pentadecyl, hexadecyl, octadecyl and icosyl.

C$_1$-C$_{12}$alkyl, C$_1$-C$_6$alkyl, C$_2$-C$_6$alkyl and C$_1$-C$_4$alkyl have the same meanings as given above for C$_1$-C$_{20}$alkyl up to the corresponding number of C-atoms.

C$_2$-C$_{20}$alkyl which is interrupted by one or more —O— is for example interrupted 1-9, 1-5, 1-3 or once or twice by —O—. Two O-atoms are separated by at least two methylene groups, namely ethylene. The alkyl groups are linear or branched. For example the following structural units will occur, —CH$_2$—CH$_2$—O—CH$_2$CH$_3$, —[CH$_2$CH$_2$O]$_y$—CH$_3$, wherein y=1-9, —(CH$_2$—CH$_2$O)$_7$—CH$_2$CH$_3$, —CH$_2$—CH(CH$_3$)—O—CH$_2$—CH$_2$CH$_3$ or —CH$_2$—CH(CH$_3$)—O—CH$_2$—CH$_3$. C$_2$-C$_6$alkyl which is interrupted by 1 or 2 —O— is for example —CH$_2$—O—CH$_2$CH$_2$—OCH$_2$CH$_3$ or —CH$_2$CH$_2$—O—CH$_2$CH$_3$.

C$_2$-C$_4$hydroxyalkyl means C$_2$-C$_4$alkyl, which substituted by one or two O-atoms. The alkyl radical is linear or branched. Examples are 2-hydroxyethyl, 1-hydroxyethyl, 1-hydroxypropyl, 2-hydroxypropyl, 3-hydroxypropyl, 1-hydroxybutyl, 4-hydroxybutyl, 2-hydroxybutyl, 3-hydroxybutyl, 2,3-dihydroxypropyl, or 2,4-dihydroxybutyl.

$C_3$-$C_8$cycloalkyl is for example cyclopropyl, cyclobutyl, cyclopentyl, cyclohexyl, cyclooctyl, especially cyclopentyl and cyclohexyl.

$C_1$-$C_4$alkoxy is linear or branched, for example, methoxy, ethoxy, propoxy, isopropoxy, n-butyloxy, sec-butyloxy, isobutyloxy, tert-butyloxy.

$C_2$-$C_{10}$alkoxyalkyl is $C_2$-$C_{10}$alkyl, which is interrupted by one O-atom. $C_2$-$C_{10}$alkyl has the same meanings as given above for $C_1$-$C_{20}$alkyl up to the corresponding number of C-atoms. Examples are methoxymethyl, methoxyethyl, methoxypropyl, ethoxymethyl, ethoxyethyl, ethoxypropyl, propoxymethyl, propoxyethyl, propoxypropyl.

$C_1$-$C_{20}$alkanoyl is linear or branched and is, for example, $C_2$-$C_{18}$-, $C_2$-$C_{14}$-, $C_2$-$C_{12}$-, $C_2$-$C_8$-, $C_2$-$C_6$- or $C_2$-$C_4$alkanoyl or $C_4$-$C_{12}$- or $C_4$-$C_8$alkanoyl. Examples are formyl, acetyl, propionyl, butanoyl, isobutanoyl, pentanoyl, hexanoyl, heptanoyl, octanoyl, nonanoyl, decanoyl, dodecanoyl, tetradecanoyl, pentadecanoyl, hexadecanoyl, octadecanoyl, icosanoyl, preferably acetyl. $C_1$-$C_{12}$alkanoyl, $C_1$-$C_8$alkanoyl, $C_1$-$C_4$alkanoyl and $C_2$-$C_4$alkanoyl have the same meanings as given above for $C_2$-$C_{20}$alkanoyl up to the corresponding number of C-atoms.

$C_4$-$C_9$cycloalkanoyl is for example cyclopropanoyl, cyclobutanoyl, cyclopentanoyl, cyclohexanoyl, cyclooctanoyl.

$C_2$-$C_4$alkanoyloxy is linear or branched, for example acetyloxy, propionyloxy, butanoyloxy, isobutanoyloxy, preferably acetyloxy.

$C_2$-$C_{12}$alkoxycarbonyl is a linear or branched and is, for example, methoxycarbonyl, ethoxycarbonyl, propoxycarbonyl, n-butyloxycarbonyl, isobutyloxycarbonyl, 1,1-dimethylpropoxycarbonyl, pentyloxycarbonyl, hexyloxycarbonyl, heptyloxycarbonyl, octyloxycarbonyl, nonyloxycarbonyl, decyloxycarbonyl or dodecyloxycarbonyl, especially methoxycarbonyl, ethoxycarbonyl, propoxycarbonyl, n-butyloxycarbonyl or iso-butyloxycarbonyl, preferably methoxycarbonyl.

$C_2$-$C_{12}$alkoxycarbonyl which is interrupted by one or more —O— is linear or branched. Two O-atoms are separated by at least two methylene groups, namely ethylene.

$C_6$-$C_{20}$aryl is for example phenyl, 1-naphthyl, 2-naphthyl, 9-anthryl, 9-phenanthryl, 1-pyrenyl, 2-pyrenyl, 1-perylenyl or 3-perylenyl, preferably phenyl or naphthyl.

$C_{10}$-$C_{20}$aryl and $C_6$-$C_{12}$aryl have the same meanings as given above for $C_6$-$C_{20}$aryl up to the corresponding number of C-atoms.

$C_6$-$C_{20}$aryloyl is for example benzoyl, 1-naphthoyl, 2-naphthoyl, 9-anthracenecarbonyl, 9-phenanthrenecarbonyl, 1-pyrenecarbonyl, 2-pyrenecarbonyl, 1-perylenecarbonyl or 3-perylenecarbonyl, preferably benzoyl or naphthoyl.

$C_{10}$-$C_{20}$aryloyl has the same meanings as given above for $C_6$-$C_{20}$aryloyl up to the corresponding number of C-atoms.

Substituted aryl radicals $Ar_1$ and $Ar_2$ are substituted 1 to 12 times. It is evident that a defined aryl radical cannot have more substituents than free positions at the aryl ring. The radicals are substituted 1 to 12 times, for example, 1 to 9 times, 1 to 6 times, 1 to 4 times, in particular one, two or three times.

$C_3$-$C_9$heteroaryl is for example 2-furyl, 3-furyl, 2-pyrrolyl, 3-pyrrolyl, 2-thienyl, 3-thienyl, 2-thiazolyl, 2-benzofuranyl, 3-benzofuranyl, 2-indolyl, 3-indolyl, 2-benzothiophenyl, 3-benzothiophenyl, 2-benzothiazolyl, 2-pyridyl, 3-pyridyl, 2-quinolyl, 3-quinolyl, 4-quinolyl, 1-isoquinolyl, 3-isoquinolyl, 4-isoquinolyl.

Phenoxycarbonyl is

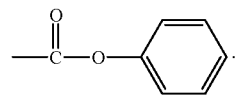

Substituted phenoxycarbonyl radicals are substituted one to four times, for example one, two or three times, especially two or three times. Substituents on the phenyl ring are preferably in positions 4 or in 3,4-, 3,4,5-, 2,6-, 2,4- or 2,4,6-position on the phenyl ring, in particular in 4- or 3,4-position.

Phenyl-$C_1$-$C_3$alkyl is for example benzyl, phenylethyl, α-methylbenzyl or α,α-dimethylbenzyl, especially benzyl.

$C_2$-$C_{20}$alkenyl radicals may be mono or polyunsaturated and are for example $C_2$-$C_{12}$-, $C_2$-$C_6$-alkenyl, e.g. allyl, methallyl, 1,1-dimethylallyl, 1-butenyl, 3-butenyl, 2-butenyl, 1,3-pentadienyl, 5-hexenyl, 7-octenyl or dodecenyl, tetradecenyl, pentadecenyl, hexadecenyl, octadecenyl and icosenyl especially allyl.

$C_3$-$C_{12}$alkenyl radicals and $C_3$-$C_5$alkenyl radicals have the same meanings as given above for $C_2$-$C_{20}$alkenyl radicals up to the corresponding number of C-atoms.

$C_2$-$C_{20}$alkynyl radicals are for example $C_2$-$C_{12}$-, $C_2$-$C_6$-alkynyl and may be mono or polyunsaturated and are for example ethynyl, propargyl, 1-butynyl, 3-butynyl, 2-butynyl, 5-hexynyl, 7-octynyl or dodecynyl, tetradecynyl, pentadecynyl, hexadecynyl, octadecynyl or icosynyl.

$C_3$-$C_6$alkenoxy radicals may be mono- or polyunsaturated and are for example allyloxy, methallyloxy, butenyloxy, pentenoxy, 1,3-pentadienyloxy, 5-hexenyloxy.

$C_3$-$C_6$alkenoyl radicals may be mono- or polyunsaturated and are for example propenoyl, 2-methyl-propenoyl, butenoyl, pentenoyl, 1,3-pentadienoyl, 5-hexenoyl.

Halogen is fluorine, chlorine, bromine and iodine, especially fluorine, chlorine and bromine, preferably fluorine and chlorine.

If the substituents $OR_3$, $SR_4$ and $NR_5R_6$ on a phenyl ring form 5- or 6-membered rings via the radicals $R_3$, $R_4$, $R_5$ and/or $R_6$ with further substituents on the phenyl ring or with one of the carbon atoms of the phenyl ring, structures comprising two or four rings (inclusive the phenyl ring or naphthyl-, anthracyl- or phenanthryl-ring) are obtained. Examples are

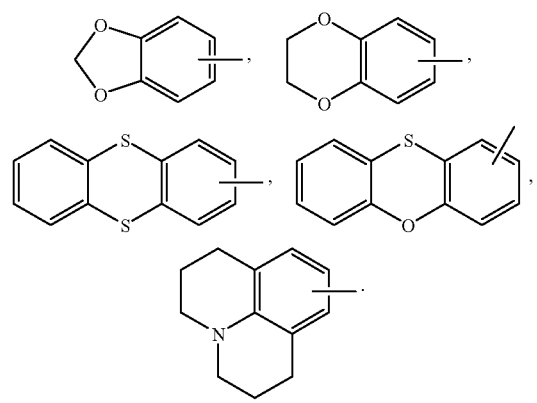

Oxime esters of formulae I and II are prepared by methods described in the literature, for example by reaction of the corresponding oximes (R$_1$=H) with an acyl chloride or an anhydride in an inert solvent such as for example t-Butyl methyl ether, tetrahydrofuran (THF) or dimethylformamide (DMF) in the presence of a base, for example triethylamine or pyridine, or in a basic solvent such as pyridine.

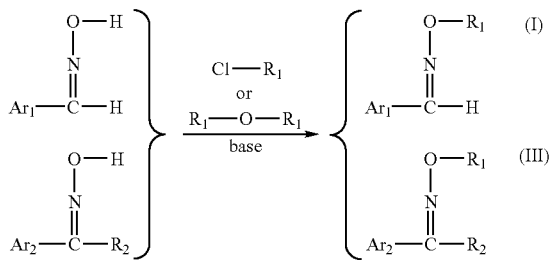

Such reactions are well known to those skilled in the art, and are generally carried out at temperatures of −15 to +50° C., preferably 0 to 25° C.

The oximes required as starting materials can be obtained by a variety of methods described in standard chemistry textbooks (for instance in J. March, Advanced Organic Chemistry, 4th Edition, Wiley Interscience, 1992), or in specialized monographs, for example, S. R. Sandler & W. Karo, Organic functional group preparations, Vol. 3, Academic Press.

One of the most convenient methods is, for example, the reaction of aldehydes or ketones with hydroxylamine or its salt in polar solvents like ethanol or aqueous ethanol. In that case, a base such as sodium acetate or pyridine is added to control the pH of the reaction mixture. It is well known that the rate of the reaction is pH-dependent, and the base can be added at the beginning or continuously during the reaction. Basic solvents such as pyridine can also be used as base and/or solvent or cosolvent. The reaction temperature is generally the refluxing temperature of the mixture, usually 60-120° C.

Another convenient synthesis of oximes is the nitrosation of "active" ethylene groups with nitrous acid or an alkyl nitrite. Both alkaline conditions, as described for example in Organic Syntheses coll. Vol. VI (J. Wiley & Sons, New York, 1988), pp 199 and 840, and acidic conditions, as described, for example, in Organic Synthesis coll. vol V, pp 32 and 373, coll. vol. III, pp 191 and 513, coll. vol. II, pp. 202, 204 and 363, are suitable for the preparation of the oximes used as starting materials in the invention. Nitrous acid is usually generated from sodium nitrite. The alkyl nitrite can be for example methyl nitrite, ethyl nitrite, isopropyl nitrite, butyl nitrite, or isoamyl nitrite.

Every oxime ester group can exist in two configurations, (Z) or (E). It is possible to separate the isomers by conventional methods, but it is also possible to use the isomeric mixture as photoinitiating species. Therefore, the invention also relates to mixtures of configurational isomers of compounds of the formulae I and II.

Especially interesting as photoinitiators for the compositions according to the present invention are compounds of formula I and II.

A preferred composition as component (B) comprises a compound of formula I or II, wherein R$_1$ is C$_2$-C$_6$alkanoyl or C$_2$-C$_5$alkoxycarbonyl; or R$_1$ is benzoyl which is unsubstituted or substituted by one or more C$_1$-C$_6$alkyl or halogen;

Ar$_1$ is phenyl or naphthyl, each of these radicals is unsubstituted or substituted 1 to 5 times by halogen, C$_1$-C$_{20}$alkyl, benzyl or C$_1$-C$_{20}$alkanoyl; or said phenyl or naphthyl is substituted by phenyl or benzoyl, each of which optionally is substituted by one or more OR$_3$, SR$_4$ or NR$_5$R$_6$; or said phenyl or naphthyl is substituted by C$_2$-C$_{12}$alkoxycarbonyl optionally interrupted by one or more —O— and/or optionally substituted by one or more OH; or said phenyl or naphthyl is substituted by OR$_3$, SR$_4$ or NR$_5$R$_6$, wherein the substituents OR$_3$, SR$_4$ or NR$_5$R$_6$ optionally form 5- or 6-membered rings via the radicals R$_3$, R$_4$, R$_5$ and/or R$_6$ with further substituents on the phenyl or naphthyl ring or with one of the carbon atoms of the phenyl or naphthyl ring;

or Ar$_1$ is furyl, pyrrolyl, thienyl, benzofuranyl, indolyl, benzothiophenyl or pyridyl, provided that R$_1$ is acetyl; wherein each of these radicals is unsubstituted or substituted 1 to 4 times by halogen, C$_1$-C$_{20}$alkyl, benzyl, C$_3$-C$_8$cycloalkyl, phenyl, C$_1$-C$_{20}$alkanoyl, benzoyl, C$_2$-C$_{12}$alkoxycarbonyl, phenoxycarbonyl, OR$_3$, SR$_4$, SOR$_4$, SO$_2$R$_4$ or NR$_5$R$_6$;

x is 2;

M$_1$ is

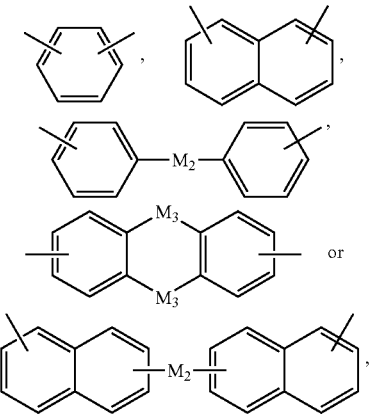

each of which optionally is substituted 1 to 4 times by halogen, C$_1$-C$_{12}$alkyl, benzyl, OR$_3$, SR$_4$ or NR$_5$R$_6$; or by phenyl which is unsubstituted or substituted by one or more OR$_3$, SR$_4$ or NR$_5$R$_6$; or by benzoyl which is unsubstituted or substituted by one or more OR$_3$, SR$_4$ or NR$_5$R$_6$; or by C$_1$-C$_{12}$alkanoyl; or by C$_2$-C$_{12}$alkoxycarbonyl optionally interrupted by one or more —O— and/or optionally substituted by one or more hydroxyl groups;

M$_2$ is a direct bond, —O—, —S—, —SS—, —NR$_3$—, —(CO)—, C$_1$-C$_{12}$alkylene, phenylene, —(CO)O—(C$_2$-C$_{12}$alkylene)-O(CO)—, —(CO)O—(CH$_2$CH$_2$O)$_n$—(CO)— or —(CO)—(C$_2$-C$_{12}$-alkylene)-(CO)—; or M$_2$ is C$_4$-C$_{12}$alkylene or C$_4$-C$_{12}$alkylenedioxy-, each of which is optionally interrupted by 1 to 5 —O—, —S— and/or —NR$_3$—;

M$_3$ is a direct bond, —CH$_2$—, —O—, —S—, —NR$_3$— or —(CO)—;

R$_3$ is hydrogen or C$_1$-C$_{20}$alkyl; or R$_3$ is C$_2$-C$_{12}$alkyl which is substituted by —OH, —SH, —O(CO)—C$_1$-C$_4$alkyl, —O(CO)-phenyl, —(CO)O(C$_1$-C$_4$alkyl), —N(C$_1$-C$_4$alkyl)$_2$, —N(CH$_2$CH$_2$OH)$_2$, —N[CH$_2$CH$_2$O—(CO)—C$_1$-C$_4$alkyl]$_2$ or morpholinyl; or R$_3$ is C$_2$-C$_{12}$alkyl which is interrupted by one or more —O—; or R$_3$ is —(CH$_2$CH$_2$O)$_{n+1}$H, —(CH$_2$CH$_2$O)$_n$(CO)—C$_1$-C$_8$alkyl, phenyl-C$_1$-C$_3$alkyl, C$_2$-C$_8$alkanoyl, C$_3$-C$_{12}$alkenyl or C$_3$-C$_6$alkenoyl; or R$_3$ is benzoyl which is unsubstituted or substituted by one or more C$_1$-C$_6$alkyl, halogen or C$_1$-C$_4$alkoxy; or R$_3$ is phenyl or naphthyl each of which is unsubstituted or substituted by halogen, $C_1$-$C_{12}$alkyl, $C_1$-$C_{12}$alkoxy, phenyl-$C_1$-$C_3$-alkoxy, phenoxy, $C_1$-$C_{12}$alkylsulfanyl, phenylsulfanyl, —N($C_1$-$C_{12}$alkyl)$_2$, diphenylamino or —(CO)R$_7$;

n is 1 to 20;

R$_4$ is hydrogen, $C_1$-$C_{20}$alkyl, $C_3$-$C_{12}$alkenyl, phenyl-$C_1$-$C_3$alkyl; $C_2$-$C_8$alkyl which is substituted by —OH, —SH, —O(CO)—$C_1$-$C_4$alkyl, —O(CO)-phenyl or —(CO)O($C_1$-$C_4$alkyl); or R$_4$ is $C_2$-$C_{12}$alkyl which is interrupted by one or more —O— or —S—; or R$_4$ is —(CH$_2$CH$_2$O)$_{n+1}$H, —(CH$_2$CH$_2$O)$_n$(CO)—$C_1$-$C_8$alkyl, $C_2$-$C_8$alkanoyl, $C_3$-$C_{12}$alkenyl, $C_3$-$C_6$alkenoyl; or R$_4$ is phenyl or naphthyl each of which is unsubstituted or substituted by halogen, $C_1$-$C_{12}$alkyl, $C_1$-$C_{12}$alkoxy or —(CO)R$_7$;

R$_5$ and R$_6$ independently of each other are hydrogen, $C_1$-$C_{20}$alkyl, $C_2$-$C_4$hydroxyalkyl, $C_2$-$C_{10}$alkoxyalkyl, phenyl-$C_1$-$C_3$alkyl, $C_1$-$C_4$alkanoyl, $C_3$-$C_{12}$alkenoyl, benzoyl; or are phenyl or naphthyl each of which is unsubstituted or substituted by $C_1$-$C_{12}$alkyl or $C_1$-$C_{12}$alkoxy; or R$_5$ and R$_6$ together are $C_2$-$C_6$alkylene optionally interrupted by —O— or —NR$_3$— and/or optionally substituted by hydroxyl, $C_1$-$C_4$alkoxy, $C_2$-$C_4$alkanoyloxy or benzoyloxy; and R$_7$ is hydrogen, $C_1$-$C_{20}$alkyl; or is $C_2$-$C_8$alkyl which is substituted by halogen, phenyl, —OH, —SH, $C_3$-$C_6$alkenoxy, —O(CO)—$C_1$-$C_4$alkyl, —O(CO)-phenyl or —(CO)O($C_1$-$C_4$alkyl); or R$_7$ is $C_2$-$C_{12}$alkyl which is interrupted by one or more —O—; or R$_7$ is —(CH$_2$CH$_2$O)$_{n+1}$H, —(CH$_2$CH$_2$O)$_n$(CO)—$C_1$-$C_8$alkyl or $C_3$-$C_{12}$alkenyl; or is phenyl optionally substituted by one or more halogen, $C_1$-$C_{12}$alkyl, $C_1$-$C_{12}$alkoxy, phenoxy, $C_1$-$C_{12}$alkylsulfanyl, phenylsulfanyl, —N($C_1$-$C_{12}$alkyl)$_2$, or diphenylamino.

Preferred is a photosensitive composition as described above, wherein component (B) is a compound of formula I, wherein R$_1$ is $C_2$-$C_4$alkanoyl;

Ar$_1$ is phenyl or naphthyl, each of which is unsubstituted or substituted by halogen, $C_1$-$C_8$alkyl, NR$_5$R$_6$ or OR$_3$, wherein the substituents OR$_3$, optionally form 5- or 6-membered rings via the radicals R$_3$ with further substituents on the phenyl or naphthyl ring; or Ar$_1$ is 2-furyl, 2-pyrrolyl, 2-thienyl, 3-indolyl, provided that R$_1$ is acetyl;

M$_1$ is

x is 2;

R$_3$ is $C_1$-$C_{20}$alkyl; or R$_3$ is $C_2$-$C_{12}$alkyl which is substituted by OH, —O(CO)—$C_1$-$C_4$alkyl, —N($C_1$-$C_4$alkyl)$_2$, —N(CH$_2$CH$_2$OH)$_2$, —N[CH$_2$CH$_2$O—(CO)—$C_1$-$C_4$alkyl or morpholinyl; or R$_3$ is $C_2$-$C_{12}$alkyl which is interrupted by one or more —O—; or R$_3$ is —(CH$_2$CH$_2$O)$_{n+1}$H or —(CH$_2$CH$_2$O)$_n$(CO)—$C_1$-$C_4$alkyl;

n is 1 to 3; and

R$_5$ and R$_6$ are $C_1$-$C_4$alkyl.

The compounds of the formulae I and II can be used as photoinitiators for the photopolymerization of ethylenically unsaturated compounds or of mixtures which comprise such compounds.

Component (A) in the composition according to the invention is a monomer, oligomer or polymer, which is soluble in aqueous alkaline developer.

Examples for suitable components (A) are oligomers and polymers having a molecular weight of about 500 to 2,000,000, preferably 1,000 to 1,000,000. Examples of alkali developable binders are acrylic polymer having carboxylic acid function as an alkali solubilizing pendant group, such as conventionally known copolymers obtained by copolymerizing an ethylenic unsaturated carboxylic acid such as (meth) acrylic acid, 2-carboxyethyl (meth)acrylic acid, 2-carboxypropyl (meth)acrylic acid itaconic acid, crotonic acid, maleic acid and fumaric acid, with one or more monomers selected from esters of (meth)acrylic acid, such as methyl (meth)acrylate, ethyl (meth)acrylate, propyl (meth)acrylate, butyl (meth)acrylate, benzyl (meth)acrylate, 2-ethylhexyl (meth)acrylate, hydroxyethyl (meth)acrylate, hydroxypropyl (meth)acrylate; vinyl aromatic compounds, such as styrene, α-methylstyrene, vinyltoluene, p-chlorostyrene; amide type unsaturated compounds, (meth)acrylamide diacetonacrylamide, N-methylolacrylamide, N-butoxymethacrylamide; and polyolefin type compounds, such as butadiene, isoprene, chloroprene and the like; methacrylonitrile, methyl isopropenyl ketone, vinyl acetate, vinyl propionate, or vinyl pivalate. Examples of copolymers are copolymers of acrylates and methacrylates with acrylic acid or methacrylic acid and with styrene or substituted styrene, phenolic resins, for example novolak, (poly)hydroxystyrene, and copolymers of hydroxystyrene with alkyl acrylates, acrylic acid and/or methacrylic acid. Preferable examples of copolymers are copolymers of methyl methacrylate/methacrylic acid, copolymers of benzyl methacrylate/methacrylic acid, copolymers of methyl methacrylate/ethyl acrylate/methacrylic acid, copolymers of benzyl methacrylate/methacrylic acid/styrene, copolymers of benzyl methacrylate/methacrylic acid/hydroxyethyl methacrylate, copolymers of methyl methacrylate/butyl methacrylate/methacrylic acid/styrene, copolymers of methyl methacrylate/benzyl methacrylate/methacrylic acid/hydroxyphenyl methacrylate. Compound (A) can also be an alkali soluble monomeric compound, provided its concentration in the formulation is sufficiently high to render the whole formulation soluble in the alkaline developer.

The functional groups in compound (A), which result in good alkaline solubility are preferably carboxylic groups. However, also other groups, which result in alkaline solubility are possible. Examples for such groups are phenolic groups, sulfonic acid groups and anhydride groups.

Furthermore, compound (A) can be an alkaline soluble polyimide precursor, for example a poly(amic acid ester) compound, optionally having photopolymerizable side groups either attached to the backbone or to the ester groups in the molecule and sufficient free phenolic groups or carboxylic groups to make this material soluble in aqueous alkali, or it can be for example, a poly(amic acid).

Other examples of alkali soluble compounds (A) include co-polymers of hydroxystyrene with styrene, alkyl acrylates, acrylic acid, alkyl methacrylates and methacrylic acid.

Further examples for component (A) are oligomers or polymers obtained by reaction of a saturated or unsaturated polybasic acid anhydride with a product of the reaction of an epoxy compound and an unsaturated monocarboxylic acid. As epoxy compounds which are employed for the preparation the most interesting ones are novolak type epoxies.

The aforementioned resin curable by an activated energy ray is obtained by causing a reaction product of a novolak type epoxy compound (as described afterward) and an unsaturated monocarboxylic acid to react with a dibasic acid anhydride such as phthalic anhydride or an aromatic polycarboxylic acid anhydride such as trimellitic acid anhydride or pyromellitic acid anhydride. In this case, the resin proves particularly suitable when, in the production thereof, the amount of the aforementioned acid anhydride used for the reaction exceeded 0.15 mol per each of the hydroxyl groups possessed by the reaction product of the novolak type epoxy compound and the unsaturated carboxylic acid.

The acid value of the resin so obtained suitably falls in the range of 45 to 160 mg KOH/g, preferably 50 to 140 mg KOH/g (the acid value is expressed by milligram number of potassium hydroxide necessary for neutralizing 1 gram of resin).

When the number of ethylenically unsaturated bonds present in the molecular unit of the resin curable by the activated energy ray is small, since the photosetting proceeds slowly, it is desirable to use a novolak type epoxy compound as a raw material. For the purpose of lowering the viscosity of the ink, it is possible to use bis-phenol A type epoxy compounds instead.

The novolak type epoxy compounds are represented by phenol novolak type epoxy resins and cresol novolak type epoxy resins. Such compounds are typically produced by reacting epichlorohydrin with a novolak resin.

Typical examples of the aforementioned acid anhydride are dibasic acid anhydrides such as for example maleic anhydride, succinic anhydride, itaconic anhydride, phthalic anhydride, tetrahydrophthalic anhydride, hexahydrophthalic anhydride, methylhexahydrophthalic anhydride, endo-methylenetetrahydrophthalic anhydride, methyl-endo-methylene-tetrahydrophthalic anhydride, chlorendic anhydride, and methyltetrahydrophthalic anhydride; aromatic polycarboxylic anhydrides such as for example trimellitic anhydride pyromellic anhydride, and benzophenone-tetracarboxylic dianhydride: and polycarboxylic anhydride derivatives such as 5-(2,5-dioxotetrahydrofuryl)-3-methyl-3-cyclohexene-1, 2-dicarboxylic anhydride.

Further examples for component (A) are reaction products obtained by adding epoxy group containing acrylic acid ester or methacrylic acid ester compounds to a part of the carboxyl groups of a copolymer resulting of the reaction of acrylate or methacrylate with acrylic acid or methacrylic acid. Examples of such compounds are represented by the general formulae (1) and (2).

(1)

wherein $R_a$ is a hydrogen atom or a methyl group, $R_b$ is an aliphatic hydrocarbon group having 1 to 6 carbon atoms, and acrylic acid and/or methacrylic acid represented by the general formula (2);

(2)

wherein $R_a$ has the same meaning as given above, according to routine methods such as solution polymerization.

Preferably the molar ratio between the acrylic acid ester and/or methacrylic acid ester and the acrylic acid and/or methacrylic acid is from 30:70 to 70:30.

The ester group of each of the acrylic acid ester and/or methacrylic acid ester may be appropriately selected from various aliphatic groups containing 1 to 6 carbon atoms.

The reaction product is obtained by adding to the copolymer thus obtained acrylic acid ester and/or methacrylic acid ester having a terminal epoxy group, represented by the following general formula (3);

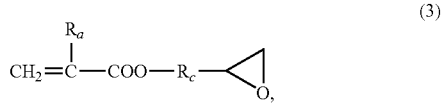

(3)

wherein $R_a$ has the same meaning as described above;

$R_c$ is an aliphatic hydrocarbon group or aromatic hydrocarbon group having 1 to 12 carbon atoms.

In order to obtain the reaction product suitable for the present invention, a compound of formula (3) is added to the aforementioned monomers of formula (1) and (2) at a ratio of 10 to 40 mol %, to provide the copolymer with ultraviolet curability.

The reaction product thus obtained is preferably has an average molecular weight in the range of 20,000 to 70,000; the softening point suitably is in the range from 35° C. to 130° C., and the acid value is 50 to 150.

Further examples for component (A) are resins having α,β-unsaturated double bonds on the side chains, and having an acid value of 50-200. The photopolymerizable resin, for example, is constituted of 70-95% by weight of an ethylenically unsaturated acid component and a copolymerizable component thereof. It is an addition product formed between a carboxyl group-containing resin having an acid value of no less than 500, preferably no less than 600 and in particular no less than 620, and having a number average molecular weight of 1,000-100,000, preferably 3,000-70,000, and an unsaturated compound having an α,β-unsaturated double bond and an epoxy group. The content of the ethylenically unsaturated acid component in the carboxyl group-containing resin of the photopolymerizable resin is 70-95% by weight, due to which the photopolymerizable resin (A) does not become insoluble in water or dilute alkaline aqueous solution even after an unsaturated compound having an α,β-unsaturated double bond and an epoxy group is added thereto, and retains its solubility. Examples of such resins are described in JP 8-339081-A.

A carboxyl group-containing resin (A), for example, is produced by dissolving 70-95% by weight, preferably 78-88% by weight and in particular 80-85% by weight, of an ethylenically unsaturated acid monomer and 5-30% by weight, preferably 12-22% by weight and in particular 15-20% by weight, of a copolymerizable monomer in a suitable unreactive solvent and thermally polymerizing the solution at 45-120° C. in the presence of a thermal polymerization initiator. Thus, a carboxyl group-containing resin having an acid value of no less than 500 and a number average molecular weight of 1,000-100,000 can be produced in a high safety and a high stability.

Specific examples of the ethylenically unsaturated monomer suitable for production of the carboxyl group-containing resin (A) include acrylic acid, methacrylic acid, crotonic acid, isocrotonic acid, angelic acid, tiglic acid, 2-ethylacrylic acid, 3-propylacrylic acid, 3-isopropylacrylic acid, succinic acid mono-hydroxyethylacrylate, phthalic acid mono-hydroxyethylacrylate, dihydrophthalic acid mono-hydroxyethylacrylate, tetrahydrophthalic acid mono-hydroxyethylacrylate, hexahydrophthalic acid monohydroxyethyl-acrylate, acrylic acid dimer, acrylic acid trimer, ω-carboxy-polycaprolactone monoacrylate and ω-carboxy-polycaprolactone monomethacrylate. Among these monomers, preferred are acrylic acid, methacrylic acid, crotonic acid, isocrotonic acid, angelic acid, tiglic acid, 2-ethylacrylic acid, 3-propylacrylic acid, 3-isopropylacrylic acid, ω-carboxy-polycaprolactone monoacrylate, ω-carboxy-polycaprolactone monomethacrylate, and the like; and particularly preferred are acrylic acid, methacrylic acid, crotonic acid, isocrotonic acid, angelic acid, tiglic acid, 2-ethylacrylic acid, 3-propylacrylic acid, 3-isopropylacrylic acid, ω-carboxy-polycaprolactone monoacrylate, and ω-carboxy-polycaprolactone monomethacrylate. These monomers may be used either alone or in mixture of two or more.

Suitable copolymerizable monomers are acrylic esters, methacrylic esters, vinyl monomers, styrene type monomers and cyclic ester monomers. Specific examples thereof include hydroxymethyl acrylate, hydroxymethyl methacrylate, 2-hydroxyethyl acrylate, 2-hydroxyethyl methacrylate, 2-hydroxypropyl acrylate, 2-hydroxypropyl methacrylate, ethyleneglycol monomethyl ether acrylate, ethyleneglycol monomethyl ether methacrylate, ethyleneglycol monoethyl ether acrylate, ethyleneglycol monoethyl ether methacrylate, glycerol acrylate, glycerol methacrylate, dipentaerythritol pentamethacrylate, dipentaerythritol pentaacrylate, dimethylaminoethyl acrylate, dimethylamino-ethyl methacrylate, tetrahydrofurfuryl acrylate, tetrahydro-furfuryl methacrylate, acrylic acid amide, methacrylic acid amide, acrylonitrile, methacrylonitrile, methyl acrylate, methyl methacrylate, ethyl acrylate, ethyl methacrylate, butyl acrylate, butyl methacrylate, isobutyl acrylate, isobutyl methacrylate, 2-ethylhexyl acrylate, 2-ethylhexyl-methacrylate, benzyl acrylate, benzyl methacrylate, acrylic acid carbitol, methacrylic acid carbitol, ∈-caprolactone-modified tetrafurfuryl acrylate, ∈-caprolactone-modified tetrafurfuryl methacrylate, diethyleneglycol ethoxyl acrylate, isodecyl acrylate, isodecyl methacrylate, octyl acrylate, octyl methacrylate, lauryl acrylate, lauryl methacrylate, tridecyl acrylate, tridecyl methacrylate, stearyl acrylate, stearyl methacrylate and the like. These monomers may be used either alone or in mixtures of two or more.

Suitable thermal polymerization initiators are for example, 2,2'-azobis-(2,4-dimethylvaleronitrile) (usable temperature 45-70° C.), 2,2'-azobis(isobutyronitrile) (usable temperature 60-90° C.), 2,2'-azobis(2-methylisobutyronitrile) (usable temperature 60-95° C.), tert-butyl peroctoate (usable temperature 75-100° C.), 1,1'-azobis(cyclohexane-1-carbonitrile) (usable temperature 80-110° C.) or 1-[(1-diazo-1-methylethyl)azo]-formamide (usable temperature 95-120° C.). At least one of the cited compounds is used.

The carboxyl group-containing resin produced according to the aforementioned method is then modified into a photopolymerizable resin whose carboxyl group is esterified and whose side chains have α,β-unsaturated double bonds, through an esterification with an unsaturated compound having an α,β-unsaturated double bond and a epoxy group. Examples of suitable compounds having an α,β-unsaturated double bond and an epoxy group, are given below. At least one member selected from the group consisting of glycidyl acrylate, glycidyl methacrylate, compounds of the formula 4, 5, 6, as defined below, is used.

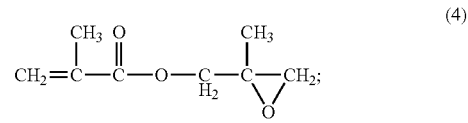

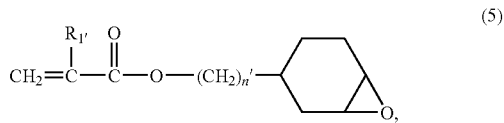

wherein
$R_1'$ is hydrogen or methyl and n' is an integer of 1-10;

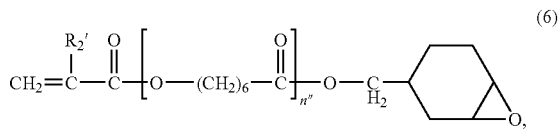

wherein
$R_2'$ is hydrogen or methyl and n'' is an integer of 1-3.

Among these compounds, compounds having alicyclic epoxy groups are particularly preferred, because these compounds have a high reactivity with carboxyl group-containing resins, accordingly the reaction time can be shortened. These compounds further do not cause gelation in the process of reaction and make it possible to carry out the reaction stably. On the other hand, glycidyl acrylate and glycidyl methacrylate are advantageous from the viewpoint of sensitivity and heat resistance because they have a low molecular weight and can give a high conversion of esterification.

The photopolymerizable resin obtained by the above-mentioned method has α,β-unsaturated double bonds on its side chains. Its acid value is 50-200, preferably 70-150, and in particular 85-120. Its number average molecular weight is 7,000-10,000, and its glass transition point (hereinafter referred to as Tg) is 30-120° C. When the photopolymerizable resin is used as a solder resist, an acid value of no less than 70 is preferable, because other additive ingredients may further be added to the composition.

An inert organic solvent is used at the time of carrying out the esterification and preparing the photosensitive resin composition.

Commercially available unsaturated monomer, oligomer and polymer components (A), as described before are, for example M-5300, M-5400, M-5600 (TOAGOSEI), EB3800, EB9692, EB9694, EB9695, EB9696 (UCB Chemicals), KAYARAD TCR1025 (Nippon Kayaku Co., LTD.), NEOPOL8319 (U-Pica), EA-6340 (Shin Nakamura Chemical Co., Ltd.), ACA200M, ACA250 (Daicel Industries, Ltd.).

Of particular interest is a photosensitive composition, wherein compound (A) is an oligomeric or polymeric compound.

Preferred is a composition, wherein the oligomer or polymer (A) is a binder polymer, in particular a copolymer of (meth)acrylate and (meth)acrylic acid, or a resin obtained by the reaction of a saturated or unsaturated polybasic acid anhydride with a product of the reaction of an epoxy compound and an unsaturated monocarboxylic acid, or is an addition product formed between a carboxyl group-containing resin and an unsaturated compound having an α,β-unsaturated double bond and an epoxy group.

Examples of compounds (C) which are suitable in the compositions according to the invention are photopolymerizable vinyl type monomers. Representative examples of the photopolymerizable vinyl type monomers are hydroxyalkyl acrylates such as 2-hydroxyethyl acrylate, 2-hydroxybutyl acrylate, etc.; mono- or diacrylates of glycols such as ethylene glycol, methoxytetraethylene glycol, polyethylene glycol, propylene glycol, etc.; acrylamides such as N,N-dimethylacrylamide, N-methylolacrylamide, etc.; aminoalkyl acrylates such as N,N-dimethylaminoethyl acrylate, etc.; polyvalent acrylates of polyvalent alcohols or ethylene oxide or propylene oxide adducts thereof such as hexanediol, trimethylolpropane, pentaerythritol, dipentaerythritol, tris-hydroxyethyl isocyanurate, etc.; phenoxy acrylate, bisphenol A diacrylate and acrylates of ethylene oxide or propylene oxide adducts of these phenols, etc.; acrylates of glycidyl ethers such as glycerin diglycidyl ether, trimethylolpropane triglycidyl ether, triglycidyl isocyanurate, etc.; and melamine acrylate, and/or methacrylates corresponding to the above acrylates, etc.

Other examples of component (C) are polyunsaturated compounds of relatively high molecular mass, for example oligomers or polymers, which are acrylated epoxy resins, polyesters containing acrylate-, vinyl ether- or epoxy-groups, and also polyurethanes and polyethers. Further examples of unsaturated oligomers are unsaturated polyester resins, which are usually prepared from maleic acid, phthalic acid and one or more diols and have molecular weights of from about 500 to 3000. In addition it is also possible to employ vinyl ether monomers and oligomers, and also maleate-terminated oligomers with polyester, polyurethane, polyether, polyvinyl ether and epoxy main chains. Particularly suitable are combinations of oligomers which carry vinyl ether groups and of polymers as described in WO 90/01512. However, copolymers of vinyl ether and maleic acid-functionalized monomers are also suitable. Unsaturated oligomers of this kind can also be referred to as prepolymers.

The photocrosslinkable compounds (C) as described above are used singly or as a mixture of two or more of them. The suitable amount is from 5 to 300 parts by weight, preferably 10 to 150 parts by weight, based on 100 parts by weight of component (A).

If the photocrosslinkable compound (C) is a low-viscous liquid, it can be used to dilute the components of the mixture so that they can be coated easily. Another purpose is to improve the photocrosslinking efficiency.

Preferred is a photosensitive composition as described above, wherein the photopolymerizable compound (C) is a liquid.

Photopolymerization can also be accelerated by adding further photosensitizers or coinitiators (as component (D)) which shift or broaden the spectral sensitivity. These are, in particular, aromatic compounds, for example benzophenone and derivatives thereof, thioxanthone and derivatives thereof, anthraquinone and derivatives thereof, coumarin and phenothiazine and derivatives thereof, and also 3-(aroylmethylene)thiazolines, rhodanine, camphorquinone, but also eosine, rhodamine, erythrosine, xanthene, thioxanthene, acridine, e.g. 9-phenylacridine, 1,7-bis(9-acridinyl)heptane, 1,5-bis(9-acridinyl)pentane, cyanine and merocyanine dyes.

Specific examples of such compounds are

1. Thioxanthones

Thioxanthone, 2-isopropylthioxanthone, 2-chlorothioxanthone, 1-chloro-4-propoxythioxanthone, 2-dodecylthioxanthone, 2,4-diethylthioxanthone, 2,4-dimethylthioxanthone, 1-methoxycarbonylthioxanthone, 2-ethoxycarbonylthioxanthone, 3-(2-methoxyethoxycarbonyl)-thioxanthone, 4-butoxycarbonylthioxanthone, 3-butoxycarbonyl-7-methylthioxanthone, 1-cyano-3-chlorothioxanthone, 1-ethoxycarbonyl-3-chlorothioxanthone, 1-ethoxycarbonyl-3-ethoxythioxanthone, 1-ethoxycarbonyl-3-aminothioxanthone, 1-ethoxycarbonyl-3-phenylsulfurylthioxanthone, 3,4-di-[2-(2-methoxyethoxy)ethoxycarbonyl]-thioxanthone, 1,3-dimethyl-2-hydroxy-9H-thioxanthen-9-one 2-ethylhexylether, 1-ethoxycarbonyl-3-(1-methyl-1-morpholinoethyl)-thioxanthone, 2-methyl-6-dimethoxymethyl-thioxanthone, 2-methyl-6-(1,1-dimethoxybenzyl)-thioxanthone, 2-morpholinomethylthioxanthone, 2-methyl-6-morpholinomethylthioxanthone, N-allylthioxanthone-3,4-dicarboximide, N-octylthioxanthone-3,4-dicarboximide, N-(1,1,3,3-tetramethylbutyl)-thioxanthone-3,4-dicarboximide, 1-phenoxythioxanthone, 6-ethoxycarbonyl-2-methoxythioxanthone, 6-ethoxycarbonyl-2-methylthioxanthone, thioxanthone-2-carboxylic acid polyethyleneglycol ester, 2-hydroxy-3-(3,4-dimethyl-9-oxo-9H-thioxanthon-2-yloxy)-N,N,N-trimethyl-1-propanaminium chloride;

2. Benzophenones benzophenone, 4-phenyl benzophenone, 4-methoxy benzophenone, 4,4'-dimethoxy benzophenone, 4,4'-dimethyl benzophenone, 4,4'-dichlorobenzophenone 4,4'-bis(dimethylamino)-benzophenone, 4,4'-bis(diethylamino)benzophenone, 4,4'-bis(methylethylamino)benzophenone, 4,4'-bis(p-isopropylphenoxy)benzophenone, 4-methyl benzophenone, 2,4,6-trimethylbenzophenone, 4-(4-methylthiophenyl)-benzophenone, 3,3'-dimethyl-4-methoxy benzophenone, methyl-2-benzoylbenzoate, 4-(2-hydroxyethylthio)-benzophenone, 4-(4-tolylthio)benzophenone, 1-[4-(4-benzoyl-phenylsulfanyl)-phenyl]-2-methyl-2-(toluene-4-sulfonyl)-propan-1-one, 4-benzoyl-N,N,N-trimethylbenzenemethanaminium chloride, 2-hydroxy-3-(4-benzoylphenoxy)-N,N,N-trimethyl-1-propanaminium chloride monohydrate, 4-(13-acryloyl-1,4,7,10,13-pentaoxatridecyl)-benzophenone, 4-benzoyl-N,N-dimethyl-N-[2-(1-oxo-2-propenyl)oxy]ethyl-benzenemethanaminium chloride;

3. Coumarins

Coumarin 1, Coumarin 2, Coumarin 6, Coumarin 7, Coumarin 30, Coumarin 102, Coumarin 106, Coumarin 138, Coumarin 152, Coumarin 153, Coumarin 307, Coumarin 314, Coumarin 314T, Coumarin 334, Coumarin 337, Coumarin 500, 3-benzoyl coumarin, 3-benzoyl-7-methoxycoumarin, 3-benzoyl-5,7-dimethoxycoumarin, 3-benzoyl-5,7-dipropoxycoumarin, 3-benzoyl-6,8-dichlorocoumarin, 3-benzoyl-6-chloro-coumarin, 3,3'-carbonyl-bis[5,7-di(propoxy)-coumarin], 3,3'-carbonyl-bis(7-methoxycoumarin), 3,3'-carbonyl-bis(7-diethylamino-coumarin), 3-isobutyroyl-coumarin, 3-benzoyl-5,7-dimethoxy-coumarin, 3-benzoyl-5,7-diethoxy-coumarin, 3-benzoyl-5,7-dibutoxycoumarin, 3-benzoyl-5,7-di(methoxyethoxy)-coumarin, 3-benzoyl-5,7-di(allyloxy)coumarin, 3-benzoyl-7-dimethylaminocoumarin, 3-benzoyl-7-diethylaminocoumarin, 3-isobutyroyl-7-dimethylaminocoumarin, 5,7-dimethoxy-3-(1-naphthoyl)-coumarin, 5,7-diethoxy-3-(1-naphthoyl)-coumarin, 3-benzoylbenzo[f]coumarin, 7-diethylamino-3-thienoylcoumarin, 3-(4-cyanobenzoyl)-5,7-dimethoxycoumarin, 3-(4-cyanobenzoyl)-5,7-dipropoxycoumarin, 7-dimethylamino-3-phenylcoumarin, 7-diethylamino-3-phenylcoumarin, the coumarin derivatives disclosed in JP 09-179299-A and JP 09-325209-A, for example 7-[{4-chloro-6-(diethylamino)-S-triazine-2-yl}amino]-3-phenylcoumarin;

4. 3-(aroylmethylene)-thiazolines 3-methyl-2-benzoylmethylene-β-naphthothiazoline, 3-methyl-2-benzoylmethylene-benzothiazoline, 3-ethyl-2-propionylmethylene-β-naphthothiazoline;

5. Rhodanines 4-dimethylaminobenzalrhodanine, 4-diethylaminobenzalrhodanine, 3-ethyl-5-(3-octyl-2-benzothiazolinylidene)-rhodanine, the rhodanine derivatives, formulae [1], [2], [7], disclosed in JP 08-305019A;

6. Other Compounds acetophenone, 3-methoxyacetophenone, 4-phenylacetophenone, benzil, 4,4'-bis(dimethylamino)benzil, 2-acetylnaphthalene, 2-naphthaldehyde, dansyl acid derivatives, 9,10-anthraquinone, anthracene, pyrene, aminopyrene, perylene, phenanthrene, phenanthrenequinone, 9-fluorenone, dibenzosuberone, curcumin, xanthone, thiomichler's ketone, α-(4-dimethylaminobenzylidene) ketones, e.g. 2,5-bis(4-diethylaminobenzylidene)cyclopentanone, 2-(4-dimethylamino-benzylidene)-indan-1-one, 3-(4-dimethylamino-phenyl)-1-indan-5-yl-propenone, 3-phenylthiophthalimide, N-methyl-3,5-di(ethylthio)-phthalimide, N-methyl-3,5-di(ethylthio)-phthalimide, phenothiazine, methylphenothiazine, amines, e.g. N-phenylglycine, triethanolamine, N-methyldiethanolamine, ethyl-p-dimethylaminobenzoate, 2-(dimethylamino)ethyl benzoate, 2-ethylhexyl-p-dimethylaminobenzoate, octyl-para-N,N-dimethylaminobenzoate, N-(2-hydroxyethyl)-N-methyl-para-toluidine, butoxyethyl 4-dimethylaminobenzoate, 4-dimethylaminoacetophenone, triethanolamine, methyldiethanolamine, dimethylaminoethanol, 2-(dimethylamino)ethyl benzoate, poly(propyleneglycol)-4-(dimethylamino) benzoate and Michler's keton. The action of the amines can be intensified by the addition of aromatic ketones of the benzophenone type. Examples of amines which can be used as oxygen scavengers are substituted N,N-dialkylanilines, as are described in EP 339841. Other accelerators, coinitiators and autoxidizers are thiols, thioethers, disulfides, phosphonium salts, phosphine oxides or phosphines, as described, for example, in EP 438123, in GB 2180358 and in JP Kokai Hei 6-68309.

A photopolymerizable composition, comprising as further additive (D) a photosensitizer compound selected from the group consisting of benzophenone and its derivatives, thioxanthone and its derivatives, anthraquinone and its derivatives, or coumarin derivatives is preferred.

Component (D) is suitably used in an amount from 0.015 to 60 parts by weight, preferably 0.03 to 30 parts by weight, based on 100 parts by weight of the sum of the compounds (A), (B) and (C).

In some cases it may be advantageous to use sensitizer compounds in combination with the compounds of the formula I and II. Another object of the invention therefore resides in a composition which additionally to the components (A), (B) and (C) comprises at least one photosensitizer compound (D), and/or further additives (E).

In addition to the photoinitiator and/or the sensitizer compound the photopolymerizable mixtures may include various additives (E).

Component (E) is, for example, a compound having an epoxy group and which renders thermosetting properties to the composition. There may be used a solid or liquid known epoxy compound, and said epoxy compound is used depending on required characteristics. For example, when the plating resistance is to be improved, a liquid epoxy resin is used, and when water resistance is required, an epoxy resin having a large number of methyl groups on a benzene ring or a cycloalkyl ring is employed. A preferred epoxy resin, is a bisphenol S type epoxy resin such as BPS-200 produced by Nippon Kayaku Co., Ltd., EPX-30 produced by ACR Co., Epiculon EXA-1514 produced by Dainippon Ink & Chemicals Inc., etc.; a bisphenol-A type epoxy resin such as Epiculon N-3050, N-7050, N-9050 produced by Dainippon Ink & Chemicals Inc., XAC-5005, GT-7004, 6484T, 6099 produced by Ciba Specialty Chemicals Inc., etc.; a bisphenol F type epoxy resin such as YDF-2004, YDF2007 produced by Tohto Kasei Co., etc.; a diglycidyl phthalate resin such as Blemmer DGT produced by Nippon Oil and Fats Co., Ltd., etc.; a heterocyclic epoxy resin such as TEPIC produced by Nissan Chemical Industries, Ltd., Araldite PT810 produced by Ciba Specialty Chemicals Inc., etc.; a bixylenol type epoxy resin such as YX-4000 produced by Yuka Shell Co., etc.; a biphenol type epoxy resin such as YL-6056 produced by Yuka Shell Co., etc.; a tetraglycidyl xylenoylethane resin such as ZX-1063 produced by Tohto Kasei Co., etc.; a novolak type epoxy resin such as EPPN-201, EOCN-103, EOCN-1020, EOCN-1025 and BRRN produced by Nippon Kayaku Co., Ltd., ECN-278, ECN-292 and ECN-299 produced by Asahi Chemical Industry Co., Ltd., GY-1180, ECN-1273 and ECN-1299 produced by Ciba Specialty Chemicals Inc., YDCN-220L, YDCN-220HH, YDCN-702, YDCN-704, YDPN-601 and YDPN-602 produced by Tohto Kasei Co., Epiculon-673, N-680, N-695, N-770 and N-775 produced by Dainippon Ink & Chemicals Inc., etc.; a novolak type epoxy resin of bisphenol A such as EPX-8001, EPX-8002, EPPX-8060 and EPPX-8061 produced by Asahi Chemical Industry Co., Ltd., Epiculon N-880 produced by Dainippon Ink & Chemicals Inc., etc.; a chelate type epoxy resin such as EPX-49-69 and EPX-49-30 produced by Asahi Denka Kogyo K.K., etc.; a glyoxal type epoxy resin such as YDG-414 produced by Tohto Kasei Co., etc.; an amino group-containing epoxy resin such as YH-1402 and ST-110 produced by Tohto Kasei Co., YL-931 and YL-933 produced by Yuka Shell Co., etc.; a rubber-modified epoxy resin such as Epiculon TSR-601 produced by Dainippon Ink & Chemicals Inc., EPX-84-2 and EPX-4061 produced by Asahi Denka Kogyo K.K., etc.; a dicyclopentadiene phenolic type epoxy resin such as DCE-400 produced by Sanyo-Kokusaku Pulp Co., Ltd., etc.; a silicone-modified epoxy resin such as X-1359 produced by Asahi Denka Kogyo K.K., etc.; an ε-caprolactone-modified epoxy resin such as Plaque G-402 and G-710 produced by Dicel Chemical Industries, Ltd., etc. and others. Further, partially esterified compounds of these epoxy compounds (e.g. esterified by (meth) acrylates) can be used in combination.

Subject of the invention therefore is a photosensitive composition as described above, additionally comprising an epoxy compound which contains at least two epoxy groups in the molecule.

The suitable amount of thermosetting component to be used according to the present invention is 10 to 150 parts by weight, preferably 20 to 80 parts by weight, based on 100 parts by weight of component (A).

Preferably, the thermosetting component is a bisphenol-A, bisphenol-S, bisphenol-F or novolak type epoxy compound.

Examples of further additives (E) are thermal inhibitors, which are intended to prevent premature polymerization, examples being hydroquinone, hydroquinone derivatives, p-methoxyphenol, β-naphthol or sterically hindered phenols, such as 2,6-di-tert-butyl-p-cresol. In order to increase the stability on storage in the dark it is possible, for example, to use copper compounds, such as copper naphthenate, stearate or octoate, phosphorus compounds, for example triphenylphosphine, tributylphosphine, triethyl phosphite, triphenyl phosphite or tribenzyl phosphite, quaternary ammonium compounds, for example tetramethylammonium chloride or trimethylbenzylammonium chloride, or hydroxylamine derivatives, for example N-diethylhydroxylamine. To exclude atmospheric oxygen during the polymerization it is possible to add paraffin or similar wax-like substances which, being of inadequate solubility in the polymer, migrate to the surface in the beginning of polymerization and form a transparent surface layer which prevents the ingress of air. It is also possible to apply an oxygen-impermeable layer. Light stabilizers which can be added in a small quantity are UV absorbers, for example those of the hydroxyphenylbenzotriazole, hydroxyphenyl-benzophenone, oxalamide or hydroxyphenyl-s-triazine type. These compounds can be used individually or in mixtures, with or without sterically hindered amines (HALS).

Examples of such UV absorbers and light stabilizers are 1. 2-(2'-hydroxyphenyl)benzotriazoles for example 2-(2'-hydroxy-5'-methylphenyl)benzotriazole, 2-(3',5'-di-tert-butyl-2'-hydroxyphenyl)benzotriazole, 2-(5'-tert-butyl-2'-hydroxyphenyl)benzotriazole, 2-(2'-hydroxy-5'-(1,1,3,3-tetramethylbutyl)phenyl)benzotriazole, 2-(3',5'-di-tert-butyl-2'-hydroxyphenyl)-5-chlorobenzotriazole, 2-(3'-tert-butyl-2'-hydroxy-5'-methylphenyl)-5-chlorobenzotriazole, 2-(3'-sec-butyl-5'-tert-butyl-2'-hydroxyphenyl)benzotriazole, 2-(2'-hydroxy-4'-octoxyphenyl)benzotriazole, 2-(3',5'-di-tert-amyl-2'-hydroxyphenyl)benzotriazole, 2-(3',5'-bis-(α,α-dimethylbenzyl)-2'-hydroxyphenyl)-benzotriazole, mixture of 2-(3'-tert-butyl-2'-hydroxy-5'-(2-octyloxycarbonylethyl)phenyl)-5-chlorobenzotriazole, 2-(3'-tert-butyl-5'-[2-(2-ethyl-hexyl-oxy)carbonylethyl]-2'-hydroxyphenyl)-5-chlorobenzotriazole, 2-(3'-tert-butyl-2'-hydroxy-5'-(2-methoxycarbonylethyl)phenyl)-5-chlorobenzotriazole, 2-(3'-tert-butyl-2'-hydroxy-5'-(2-methoxycarbonylethyl)phenyl)-benzotriazole, 2-(3'-tert-butyl-2'-hydroxy-5'-(2-octyloxycarbonylethyl)phenyl)benzotriazole, 2-(3'-tert-butyl-5'-[2-(2-ethylhexyloxy)carbonylethyl]-2'-hydroxyphenyl)benzotriazole, 2-(3'-dodecyl-2'-hydroxy-5'-methylphenyl)benzotriazole, and 2-(3'-tert-butyl-2'-hydroxy-5'-methylphenyl)benzotriazole, 5'-(2-isooctyloxycarbonylethyl)phenylbenzotriazole, 2,2'-methylenebis[4-(1,1,3,3-tetramethylbutyl)-6-benzotriazol-2-yl-phenol]; transesterification product of 2-[3'-tert-butyl-5'-(2-methoxycarbonylethyl)-2'-hydroxy-phenyl]-benzotriazole with polyethylene glycol 300; [R—CH$_2$CH$_2$—COO(CH$_2$)$_3$]$_2$— where R=3'-tert-butyl-4'-hydroxy-5'-2H-benzotriazol-2-yl-phenyl.

2. 2-Hydroxybenzophenones, for example the 4-hydroxy-, 4-methoxy-, 4-octoxy-, 4-decyloxy-, 4-dodecyloxy-, 4-benzyloxy-, 4,2',4'-trihydroxy- and 2'-hydroxy-4,4'-dimethoxy derivative.

3. Esters of substituted or unsubstituted benzoicacids, for example 4-tert-butylphenyl salicylate, phenyl salicylate, octylphenyl salicylate, dibenzoylresorcinol, bis(4-tert-butylbenzoyl)resorcinol, benzoylresorcinol, 2,4-di-tert-butylphenyl 3,5-di-tert-butyl-4-hydroxybenzoate, hexadecyl 3,5-di-tert-butyl-4-hydroxybenzoate, octadecyl 3,5-di-tert-butyl-4-hydroxybenzoate, and 2-methyl-4,6-di-tert-butylphenyl 3,5-di-tert-butyl-4-hydroxybenzoate.

4. Acrylates, for example isooctyl or ethyl α-cyano-β,β-diphenyl acrylate, methyl α-carbomethoxycinnamate, butyl or methyl α-cyano-β-methyl-p-methoxycinnamate, methyl α-carboxymethoxy-p-methoxycinnamate and N-(β-carbomethoxy-β-cyanovinyl)-2-methylindoline.

5. Sterically hindered amines, for example bis-(2,2,6,6-tetramethylpiperidyl) sebacate, bis-(2,2,6,6-tetramethylpiperidyl) succinate, bis-(1,2,2,6,6-pentamethylpiperidyl) sebacate, bis-(1,2,2,6,6-pentamethylpiperidyl) n-butyl-3,5-di-tert-butyl-4-hydroxybenzylmalonate, condensation product of 1-hydroxyethyl-2,2,6,6-tetramethyl-4-hydroxypiperidine and succinic acid, condensation product of N,N'-bis-(2,2,6,6-tetramethyl-4-piperidyl)hexa-methylenediamine and 4-tert-octylamino-2,6-dichloro-1,3,5-s-triazine, tris-(2,2,6,6-tetramethyl-4-piperidyl) nitrilotriacetate, tetrakis-(2,2,6,6-tetramethyl-4-piperidyl)-1,2,3,4-butane tetraoate, 1,1'-(1,2-ethandiyl)bis(3,3,5,5-tetramethyl-piperazinone), 4-benzoyl-2,2,6,6-tetramethylpiperidine, 4-stearyloxy-2,2,6,6-tetramethylpiperidine, bis-(1,2,2,6,6-pentamethylpiperidyl) 2-n-butyl-2-(2-hydroxy-3,5-di-tert-butylbenzyl) malonate, 3-n-octyl-7,7,9,9-tetramethyl-1,3,8-triazaspiro-[4.5]decane-2,4-dione, bis-(1-octyloxy-2,2,6,6-tetramethylpiperidyl) sebacate, bis-(1-octyloxy-2,2,6,6-tetramethylpiperidyl) succinate, condensation product of N,N'-bis-(2,2,6,6-tetra-methyl-4-piperidyl)hexamethylenediamine and 4-morpholino-2,6-dichloro-1,3,5-triazine, condensation product of 2-chloro-4,6-di-(4-n-butylamino-2,2,6,6-tetramethylpiperidyl)-1,3,5-triazine and 1,2-bis-(3-aminopropyl-amino) ethane, condensation product of 2-chloro-4,6-di-(4-n-butylamino-1,2,2,6,6-pentamethylpiperidyl)-1,3,5-triazine and 1,2-bis-(3-aminopropylamino)ethane, 8-acetyl-3-dodecyl-7,7,9,9-tetramethyl-1,3,8-triazaspiro[4.5]decane-2,4-dione, 3-dodecyl-1-(2,2,6,6-tetramethyl-4-piperidyl)pyrrolidine-2,5-dione and 3-dodecyl-1-(1,2,2,6,6-penta-methyl-4-piperidyl)-pyrrolidine-2,5-dione.

6. Oxalamides, for example 4,4'-dioctyloxyoxanilide, 2,2'-diethoxyoxanilide, 2,2'-dioctyloxy-5,5'-di-tert-butyloxanilide, 2,2'-didodecyloxy-5,5'di-tert-butyloxanilide, 2-ethoxy-2'-ethyl-oxanilide, N,N'-bis-(3-dimethylaminopropyl) oxalamide, 2-ethoxy-5-tert-butyl-2'-ethyloxanilide and its mixture with 2-ethoxy-2'-ethyl-5,4'-di-tert-butyloxanilide, mixtures of o- and p-methoxy- and of o- and p-ethoxy-disubstituted oxanalides.

7. 2-(2-Hydroxyphenyl)-1,3,5-triazines, for example 2,4,6-tris(2-hydroxy-4-octyloxyphenyl)-1,3,5-triazine, 2-(2-hydroxy-4-octyloxyphenyl)-4,6-bis-(2,4-dimethylphenyl)-1,3,5-triazine, 2-(2,4-dihydroxyphenyl)-4,6-bis(2,4-dimethylphenyl)-1,3,5-triazine, 2,4-bis(2-hydroxy-4-propyloxy-phenyl)-6-(2,4-dimethylphenyl)-1,3,5-triazine, 2-(2-hydroxy-4-octyloxyphenyl)-4,6-bis(4-methylphenyl)-1,3,5-triazine, 2-(2-hydroxy-4-dodecyloxyphenyl)-4,6-bis(2,4-dimethylphenyl)-1,3,5-triazine, 2-[2-hydroxy-4-(2-hydroxy-3-butyloxy-propyloxy)phenyl]-4,6-bis(2,4-dimethylphenyl)-1,3,5-triazine, 2-[2-hydroxy-4-(2-hydroxy-3-octyloxy-propyloxy)phenyl]-4,6-bis(2,4-dimethylphenyl)-1,3,5-triazine, 2-[4-dodecyl/tridecyl-oxy-(2-hydroxypropyl)oxy-2-hydroxy-phenyl]-4,6-bis(2,4-dimethylphenyl)-1,3,5-triazine.

8. Phosphites and phosphonites, for example triphenyl phosphite, diphenyl alkyl phosphites, phenyl dialkyl phosphites, tris(nonylphenyl) phosphite, trilauryl phosphite, trioctadecyl phosphite, distearyl pentaerythrityl diphosphite, tris-(2,4-di-tert-butylphenyl) phosphite, diisodecyl pentaerythrityl diphosphite, bis-(2,4-di-tert-butylphenyl) pentaerythrityl diphosphite, bis-(2,6-di-tert-butyl-4-methylphenyl) pentaerythrityl diphosphite, bis-isodecyloxy pentaerythrityl diphosphite, bis-(2,4-di-tert-butyl-6-methylphenyl) pentaerythrityl diphosphite, bis-(2,4,6-tri-tert-butylphenyl) pentaerythrityl diphosphite, tristearyl sorbityl triphosphite, tetrakis-(2,4-di-tert-butylphenyl)-4,4'-biphenylene diphosphonite, 6-isooctyloxy-2,4,8,10-tetra-tert-butyl-12H-dibenzo[d,g]-1,3,2-dioxaphosphocine, 6-fluoro-2,4,8,10-tetra-tert-butyl-12-methyl-dibenzo[d,g]-1,3,2-dioxaphosphocine, bis-(2,4-di-tert-butyl-6-methylphenyl) methyl phosphite and bis(2,4-di-tert-butyl-6-methylphenyl) ethyl phosphite.

In the photosensitive resin composition of the present invention, for improving characteristics such as adhesion property, hardness, etc., if necessary, there may be used an inorganic filler such as for example barium sulfate, barium titanate, silicon oxide powder, particulate silicone oxide, amorphous silica, talc, clay, magnesium carbonate, calcium carbonate, aluminium oxide, aluminium hydroxide, mica powder, etc. The ration of the filler in the formulation is 0 to 60% by weight, preferably 5 to 40% by weight of the photosensitive thermosetting resin composition.

Further, if, necessary, there may be used known additives such as a known coloring agents, e.g. Phthalocynine Blue, Phthalocyanine Green, Diazo Yellow, Crystal Violet, titanium oxide, carbone black, naphthalene black, etc.

The composition optionally additionally comprises as component (E) epoxy curing promoters such as, for example, an amine compound, an imidazole compound, a carboxylic acid, a phenol, a quaternary ammonium salt, or a methylol group-containing compound. The amount of said curing agent to be used is in the range of 0 to 10% by weight, preferably 0.05 to 5% by weight, of the photosensitive thermosetting resin composition.

To accelerate the photopolymerization it is possible to add amines, for example triethanolamine, N-methyldiethanolamine, p-dimethylaminobenzoate or Michler's ketone and compounds as described above. The action of the amines can be intensified by the addition of aromatic ketones of the benzophenone type. Examples of amines which can be used as oxygen scavengers are substituted N,N-dialkylanilines, as are described in EP 339841. Other accelerators, coinitiators and autoxidizers are thiols, thioethers, disulfides, phosphonium salts, phosphine oxides or phosphines, as described, for example, in EP 438123, in GB 2180358 and in JP Kokai Hei 6-68309.

It is further possible to add chain transfer agents which are customary in the art to the compositions according to the invention. Examples are mercaptans and amines.

The curing process can be assisted by, in particular, compositions which are pigmented (for example with titanium dioxide), and also by adding a component which under thermal conditions forms free radicals, for example an azo compound such as 2,2'-azobis(4-methoxy-2,4-dimethylvaleronitrile), a triazene, diazo sulfide, pentazadiene or a peroxy compound, for instance a hydroperoxide or peroxycarbonate, for example t-butyl hydroperoxide, as described for example in EP 245639.

The compositions according to the invention may comprise as further additive (E) a photoreducable dye, e.g., xanthene-, benzoxanthene-, benzothioxanthene, thiazine-, pyronine-, porphyrine- or acridine dyes, and/or trihalogenmethyl compounds which can be cleaved by irradiation. Similar compositions are for example described in EP 445624.

Further customary additives (E), depending on the intended use, are optical brighteners, wetting agents or levelling assistants.

In order to cure thick and pigmented coatings it is appropriate to add glass microspheres or pulverized glass fibres, as described for example in U.S. Pat. No. 5,013,768.

Accordingly, subject of the invention are compositions as described above, comprising further additives (E), which are selected from the group consisting of epoxy compounds, thermal polymerization inhibitors, inorganic fillers, colourants, epoxy curing agents, amines, chain transfer agents, thermal radical initiators, photoreducable dyes, optical brighteners, thickeners, antifoaming agents and leveling agents, in particular inorganic fillers.

The choice of additive(s) (E) is made depending on the field of application and on properties required for this field. The additives described above are customary in the art and accordingly are added in amounts which are usual in the respective application.

Subject of the invention also is a composition, comprising additionally at least one photoinitiator (B1).

In certain cases it may be of advantage to use mixtures of two or more of the novel photoinitiators. It is of course also possible to use mixtures with known photoinitiators (B1), for example mixtures with camphor quinone, benzophenone, benzophenone derivatives, acetophenone, acetophenone derivatives, for example α-hydroxycycloalkyl phenyl ketones or dialkoxyacetophenones, α-hydroxyacetophenones, e.g. 2-hydroxy-2-methyl-1-phenyl-propanone, or α-aminoacetophenones, e.g. (4-methylthiobenzoyl)-1-methyl-1-morpholinoethane, (4-morpholinobenzoyl)-1-benzyl-1-dimethylaminopropane, 4-aroyl-1,3-dioxolanes, benzoin alkyl ethers and benzil ketals, e.g. dimethyl benzil ketal, phenylglyoxalic esters and derivatives thereof, dimeric phenylglyoxalic esters, diacetyl, peresters, e,g. benzophenone tetracarboxylic peresters as described for example in EP 126541, monoacyl phosphine oxides, e.g. (2,4,6-trimethyl-benzoyl)diphenylphosphine oxide, bisacylphosphine oxides, bis(2,6-dimethoxy-benzoyl)-(2,4,4-trimethyl-pentyl)phosphine oxide, bis(2,4,6-trimethylbenzoyl)-phenylphosphine oxide, bis(2,4,6-trimethylbenzoyl)-2,4-dipentoxyphenylphosphine oxide, trisacylphosphine oxides, halomethyl-triazines, e.g. 2-[2-(4-methoxy-phenyl)-vinyl]-4,6-bis-trichloromethyl-[1,3,5]triazine, 2-(4-methoxy-phenyl)-4,6-bis-trichloromethyl-[1,3,5]triazine, 2-(3,4-dimethoxyphenyl)-4,6-bis-trichloromethyl-[1,3,5]triazine, 2-methyl-4,6-bis-trichloromethyl-[1,3,5]triazine, 2-(4-N,N-di(ethoxycarbonylmethyl)aminophenyl)-4,6-bis(trichloromethyl)-[1,3,5]triazine, 2-(4-methoxy-naphthyl)-4,6-bis-trichloromethyl-[1,3,5]triazine, 2-(1,3-benzodioxol-5-yl)-4,6-bis-trichloromethyl-[1,3,5]triazine, 2-[2-[4-(pentyloxy)phenyl]ethenyl]-4,6-bis-trichloromethyl-[1,3,5]-triazine, 2-[2-(3-methyl-2-furanyl)-ethenyl]-4,6-bis-trichloromethyl-[1,3,5]triazine, 2-[2-(5-methyl-2-furanyl)-ethenyl]-4,6-bis-trichloromethyl-[1,3,5]triazine, 2-[2-(2,4-dimethoxy-phenyl)ethenyl]-4,6-bis-trichloromethyl-[1,3,5]triazine, 2-[2-(2-methoxy-phenyl)ethenyl]-4,6-bis-trichloromethyl-[1,3,5] triazine, 2-[2-[4-isopropyloxy-phenyl]-ethenyl]-4,6-bis-trichloromethyl-[1,3,5]triazine, 2-[2-(3-chloro-4-methoxy-phenyl)ethenyl]-4,6-bis-trichloromethyl-[1,3,5]triazine, 2-[2-bromo-4-N, N-di(ethoxycarbonylmethyl)amino-phenyl]-4,6-bis-trichloromethyl-[1,3,5]triazine, 2-[2-chloro-4-N,N-di(ethoxycarbonylmethyl)amino-phenyl]-4,6-bis-trichloromethyl-[1,3,5]triazine, 2-[3-bromo-4-N,N-di(ethoxycarbonylmethyl)amino-phenyl]-4,6-bis-trichloromethyl-[1,3,5]triazine, 2-[3-chloro-4-N,N-di(ethoxycarbonylmethyl)amino-phenyl]-4,6-bis-trichloromethyl-[1,3,5]triazine, or other halomethyl-triazines as described for example in G. Buhr, R. Dammel and C. Lindley Polym. Mater. Sci. Eng. 61, 269 (1989), and EP 0262788; halomethyl-oxazol photoinitiators, such as described in U.S. Pat. No. 4,371,606 and U.S. Pat. No. 4,371,607; 1,2-disulfones, such as described in E. A. Bartmann, Synthesis 5, 490 (1993); hexaarylbisimidazole, and hexaarylbisimidazole/coinitiators systems, e.g. ortho-chlorohexaphenyl-bisimidazole combined with 2-mercaptobenzthiazole, ferrocenium compounds, or titanocenes, e.g. bis(cyclopentadienyl)-bis(2,6-difluoro-3-pyrryl-phenyl)titanium.

Where the novel photoinitiator systems are employed in hybrid systems, use is made, in addition to the novel free-radical hardeners, of cationic photoinitiators, of peroxide compounds, such as benzoyl peroxide (other suitable peroxides are described in U.S. Pat. No. 4,950,581 column 19, lines 17-25), of aromatic sulfonium-, phosphonium- or iodonium salts as described for example in U.S. Pat. No. 4,950,581, column 18, line 60 to column 19, line 10 or cyclopentadienyl-arene-iron(II) complex salts, for example ($\eta^6$-iso-propylbenzene)($\eta^5$-cyclopentadienyl)-iron(II) hexafluorophosphate, as well as oxime sulfonic acid esters, as are, for example described in EP 780729. Also pyridinium and (iso)quinolinium salts as described e.g. in EP 497531 and EP 441232 may be used in combination with the new photoinitiators.

The photoinitiators (B), either alone or in mixtures with other known photoinitiators (B1) and sensitizers (D), can be used also in the form of a dispersion or emulsion in water or aqueous solutions.

The photoinitiator (B) usually is added in an amount of 0.015 to 60 parts by weight, preferably 0.03 to 30 parts by weight, based on 100 parts by weight of the sum of components (A) and (C).

The amount refers to the sum of all photoinitiators added, if mixtures of initiators are employed. Accordingly, the amount either refers to the photoinitiator (B) or the photoinitiators (B)+(B1).

The invention also pertains to compositions comprising 100 parts by weight of component (A), 0.015 to 120 parts by weight of component (B), 5 to 500 parts by weight, for example 5 to 300 parts by weight, of component (C) and 0.015 to 120 parts by weight of component (D).

The novel radiation-sensitive compositions find application as negative resists, having a very high sensitivity to light and being able to be developed in an aqueous alkaline medium without swelling. They are suitable as photoresists for electronics (electroless plating resist, electroplating resist, etch resist, solder resist, photoimageable insulating and dielectric layer).

The composition is applied uniformly to a substrate by means of known coating techniques, for example by spin coating, dip coating, knife coating, curtain coating, screen coating, brushing, spraying, especially by electrostatic spraying, and reverse-roll coating, and also by means of electrophoretic deposition. It is also possible to apply the photosensitive layer to a temporary, flexible support and then to coat the final substrate, for example a copper-clad circuit board, by transferring the layer via lamination.

The examples of suitable organic solvents, which adjust the viscosity of the composition suitable for the used coating technique, are ketones such as ethyl methyl ketone, cyclohexanone, cyclopentanone, 2-pentanone, 2-heptanone, etc.; aromatic hydrocarbons such as toluene, xylene, tetramethylbenzene, etc.; glycol ethers such as methyl cellosolve, ethyl cellosolve, butyl cellosolve, benzyl cellosolve, phenyl cellosolve, methylcarbitol, butylcarbitol, propylene glycol monomethyl ether, dipropylene glycol monomethyl ether, dipropylene glycol monobutyl ether, triethylene glycol monoethyl ether, etc.; esters such as ethyl acetate, butyl acetate, ethyllactate, methyl-3-methoxypropionate, ethyl-3-ethoxypropionate and esterified products of the above glycol ethers such as cellosolve acetate, butyl cellosolve acetate, propylene glycol monomethylether acetate, carbitol acetate, butyl carbitol acetate; alcohols such as ethanol, propanol, n-butanol, n-hexanol, n-heptanol, n-octanol, ethylene glycol, propylene glycol, etc.; aliphatic hydrocarbons such as octane, decane, etc.; a petroleum type solvent such as petroleum ether, petroleum naphtha, hydrogenated petroleum naphtha, solvent naphtha, etc. and others, such as for example, N-methylpyrrolidinone and gamma-butyrolactone. The organic solvent is used for diluting the resin so that it can be coated easily.

The quantity applied (coat thickness) and the nature of the substrate (layer support) are dependent on the desired field of application. The range of coat thicknesses generally comprises values from about 0.1 µm to more than 100 µm, for example 0.1 µm to 1 cm, preferably 0.5 µm to 1000 µm.

Following the coating of the substrates, the solvent is removed, generally by drying, to leave a film of the photoresist on the substrate.

The term "imagewise" exposure includes both, exposure through a photomask comprising a predetermined pattern, for example a slide, a chromium mask, a stencil mask or a reticle, as well as exposure by means of a laser or light beam, which for example is moved under computer control over the surface of the coated substrate and in this way produces an image, and irradiation with computer-controlled electron beams. It is also possible to use masks made of liquid crystals that can be addressed pixel by pixel to generate digital images, as is, for example, described by A. Bertsch, J. Y. Jezequel, J. C. Andre in Journal of Photochemistry and Photobiology A: Chemistry 1997, 107, p. 275-281 and by K.-P. Nicolay in Offset Printing 1997, 6, p. 34-37.

As already mentioned, the compositions can be developed by aqueous alkalis. Particularly suitable aqueous-alkaline developer solutions are aqueous solutions of tetraalkylammonium hydroxides or of alkali metal silicates, phosphates, hydroxides and carbonates. Minor quantities of wetting agents and/or organic solvents may also be added, if desired, to these solutions. Examples of typical organic solvents, which may be added to the developer liquids in small quantities, are cyclohexanone, 2-ethoxyethanol, toluene, acetone, N-methylpyrrolidinone and mixtures of such solvents.

The photosensitivity of the novel compositions can extend in general from about 150 nm to 600 nm, for example 190-600 nm (UV-vis region). Suitable radiation is present, for example, in sunlight or light from artificial light sources. Consequently, a large number of very different types of light sources are employed. Both point sources and arrays ("lamp carpets") are suitable. Examples are carbon arc lamps, xenon arc lamps, super high-, high-, medium- and low-pressure mercury lamps, possibly with metal halide dopes (metal-halogen lamps), microwave-stimulated metal vapor lamps, excimer lamps, superactinic fluorescent tubes, fluorescent lamps, argon incandescent lamps, electronic flashlights, photographic flood lamps, light emitting diodes (LED), electron beams and X-rays. The distance between the lamp and the substrate to be exposed in accordance with the invention may vary depending on the intended application and the type and output of lamp, and may be, for example, from 2 cm to 150 cm. Laser light sources, for example excimer lasers, such as KrF lasers for exposure at 248 nm, ArF-lasers for exposure at 193 nm and $F_2$ lasers for exposure at 157 nm are also suitable. Lasers in the visible region can also be employed.

The invention therefore also provides a process for the photopolymerization of compounds containing at least one ethylenically unsaturated double bond, which comprises adding to the abovementioned compounds at least one photoinitiator of formula I or II as described above and irradiating the resulting composition with electromagnetic radiation, in particular light of the wavelength 150 to 600 nm, namely a process for the photopolymerization of compounds containing ethylenically unsaturated double bonds, which comprises irradiating a composition as described above with electromagnetic radiation in the range from 150 to 600 nm.

The invention also pertains to a coated substrate which is coated on at least one surface with a composition as described above, as well as to a process for the photographic production of relief images, in which said coated substrate is subjected to imagewise exposure with electromagnetic radiation in the range from 150 to 600 nm, and then the unexposed portions are removed with a solvent.

The compositions of the invention have a high sensitivity and resolution even at low concentration of the photoinitiator, with or without a sensitizer and are particularly suitable in aqueous developable photoresist applications. They have a good thermal stability and low volatility.

The novel radiation-sensitive compositions find application as negative resists, having a very high sensitivity to light and being able to be developed in an aqueous alkaline medium without swelling. They are suitable as photoresists for electronics like electroplating resist, etch resist, both liquid and dry films, solder resist, as resists to manufacture color filters for a variety of display applications or to generate structures in the manufacturing process of plasma-display panels and electroluminescence displays, the production of printing plates, such as offset printing plates or screen printing plates, for the production of printing forms for relief printing, planographic printing, photogravure or of screen printing forms, for the production of relief copies, for example for the production of texts in braille, for the production of stamps, for use in chemical milling or as a microresist in the production of integrated circuits. The compositions further may be used as photopatternable dielectric layer or coating, encapsulating material and isolating coating in the production of computer chips, printed boards and other electric or electronic components. The possible layer supports, and the processing conditions of the coating substrates, are just as varied.

Because the photocurable compositions according to the invention have a good thermal stability and are sufficiently resistant to inhibition by oxygen, they are particularly suitable for the production of color filters or color mosaic systems, such as described, for example, in EP 320 264. Color filters usually are employed in the manufacturing of LCD's, projection systems and image sensors. The color filters can be used, for example, for display and image scanner in television receivers, video monitors or computers, in flat panel display technology etc.

Accordingly, a subject of the present invention is a color filter resist comprising a composition as described above and below in detail.

The color filters usually are prepared by forming red, green and blue pixels and a black matrix on a glass substrate. In these processes photocurable compositions according to the invention can be employed. A particularly preferred method of use comprises the coating of the substrate with the composition of the invention, drying of the coating with a short heat treatment, patternwise exposure of the coating to actinic radiation and subsequent development of the pattern in an aqueous alkaline developer solution and optionally a heat treatment. Thus, by subsequently applying a red, green and blue pigmented coating, in any desired order, on top of each other with this process a color filter layer with red, green and blue color pixels can be produced.

The development is carried out by washing out the areas which were not polymerized with a suitable alkali developing solution. This process is repeated to form the image having plural colors.

In the light-sensitive resin composition of the present invention, with a process in which at least one or more picture elements are formed on a transparent substrate and then an exposure is given from a side of the transparent substrate, on which the above picture elements are not formed, the above picture elements can be utilized as a light-shielding mask. In this case, for example, in the case where an overall exposure is given, a position adjustment of a mask gets unnecessary and a concern on a position slippage thereof is removed. And, it is possible to cure all of the part on which the above picture elements are not formed. Further, in this case, it is possible as well to develop and remove a part of the portion on which the above picture elements are not formed by using partially a light-shielding mask.

Since in either case, no gap is formed between the picture elements which are formed formerly and those which are formed later, the composition of the present invention is suitable for, for example, a forming material for a color filter. To be concrete, the coloring matters, dyes and pigments of red, green and blue colors are added to the light-sensitive resin composition of the present invention, and the processes for forming an image are repeated to form the picture elements of red, green and blue colors. Then, the light-sensitive resin composition to which, for example, the black coloring materials, dyes and pigments are added is provided on an overall face. An overall exposure (or a partial exposure via a light-shielding mask) can be provided thereon to form the picture elements of a black color all over the spaces (or all but a partial region of the light-shielding mask) between the picture elements of red, green and blue colors.

In addition to a process in which the light-sensitive resin composition is coated on a substrate and dried, the light-sensitive resin composition of the present invention can be used as well for a layer transfer material. That is, the light-sensitive resin composition is layer-wise provided directly on a temporary support, preferably on a polyethylene terephthalate film, or on a polyethylene terephthalate film on which an oxygen-shielding layer and a peeling layer or the peeling layer and the oxygen-shielding layer are provided. Usually, a removable cover sheet made of a synthetic resin is laminated thereon for a protection in handling. Further, there can be applied as well a layer structure in which an alkali soluble thermoplastic resin layer and an intermediate layer are provided on a temporary support and further a light-sensitive resin composition layer is provided thereon (JP 5-173320-A).

The above cover sheet is removed in use and the light-sensitive resin composition layer is laminated on a permanent support. Subsequently, peeling is carried out between those layer and a temporary support when an oxygen-shielding layer and a peeling layer are provided, between the peeling layer and the oxygen-shielding layer when the peeling layer and the oxygen-shielding layer are provided, and between the temporary support and the light-sensitive resin composition layer when either the peeling layer or the oxygen-shielding layer is not provided, and the temporary support is removed.

A metal support, glass, ceramics, and a synthetic resin film can be used as a support for a color filter. Glass and a synthetic resin film which is transparent and have an excellent dimension stability is particularly preferred.

The thickness of the light-sensitive resin composition layer is usually 0.1 to 50 micrometers, in particular 1 to 5 micrometers.

A diluted aqueous solution of an alkaline substance is used as a developing solution for the light-sensitive resin composition of the present invention, and further a solution prepared by adding a small amount of a water-miscible organic solvent thereto is included as well.

Examples of suitable alkaline materials include alkali metal hydroxides (for example, sodium hydroxide and potassium hydroxide), alkali metal carbonates (for example, sodium carbonate and potassium carbonate), alkali metal bicarbonates (for example, sodium bicarbonate and potassium bicarbonate), alkali metal silicates (for example, sodium silicate and potassium silicate), alkali metal metasilicates (for example, sodium metasilicate and potassium metasilicate), triethanolamine, diethanolamine, monoethanolamine, morpholine, tetraalkylammonium hydroxides (for example, tetramethylammonium hydroxide), or trisodium phosphate. The concentration of the alkaline substance is 0.01 to 30 weight %, and pH is preferably 8 to 14.

Suitable organic solvents which are miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, epsilon-caprolactone, gamma-butylolactone, dimethylformamide, dimethylacetoamide, hexamethylphosphoramide, ethyl lactate, methyl lactate, epsilon-caprolactam, and N-methyl-pyrrolidone. The concentration of the organic solvent which is miscible with water is 0.1 to 30 weight %.

Further, a state of the art surface active agent known to the person skilled in the art can be added. The concentration of the surface active agent is preferably 0.001 to 10 weight %.

The developing solution can be used in either form of a bath solution or a spraying solution. In order to remove the non-cured portion of the light-sensitive resin composition layer, there can be combined the methods such as rubbing with a rotary brush and rubbing with a wet sponge. Usually, the temperature of the developing solution is preferably at and around room temperature to 40° C. The developing time is changeable according to the specific kind of the photosensitive resin composition, the alkalinity and temperature of the developing solution, and the kind and concentration of the organic solvent in the case where it is added. Usually, it is 10 seconds to 2 minutes. It is possible to put a rinsing step after the development processing.

A final heat treatment is preferably carried out after the development processing. Accordingly, a support having a layer which is photopolymerized by exposing (hereinafter referred to as a photocured layer) is heated in an electric furnace and a drier, or the photocured layer is irradiated with an infrared lamp or heated on a hot plate. The heating temperature and time depend on the composition used and the thickness of the formed layer. In general, heating is preferably applied at about 120° C. to about 250° C., for about 5 to about 60 minutes.

The pigment which can be comprised in the composition according to the present invention, including a pigmented color filter resist composition, is preferably a processed pigment, for example a powdery or pasty product prepared by finely dispersing a pigment into at least one resin selected from the group consisting of acrylic resin, vinyl chloride-vinyl acetate copolymer, maleic acid resin and ethyl cellulose resin.

The red pigment comprises, for example, an anthraquinone type pigment alone, a perylene type pigment alone, or a mixture consisting of at least one of them and a disazo type yellow pigment or an isoindoline type yellow pigment, in particular C.I. Pigment Red 177 alone, C.I. Pigment Red 155 alone or a mixture consisting of at least one member of C.I. Pigment Red 177, C.I. Pigment Red 155 and C.I. Pigment Yellow 83 or C.I. Pigment Yellow 139 ("C.I." refers to the Color Index, known to the person skilled in the art and publicly available). Further suitable examples for the pigment are C.I. Pigment Red 105, 144, 149, 176, 177, 185, 202, 209, 214, 222, 242, 254, 255, 264, 272 and C.I. Pigment Yellow 24, 31, 53, 83, 93, 95, 109, 110, 128, 129, 138, 139, 166 and C.I. Pigment Orange 43.

The green pigment comprises for instance a halogenated phthalocyanine type pigment alone or its mixture with a disazo type yellow pigment or an isoindoline type yellow pigment, in particular C.I. Pigment Green 7 alone, C.I. Pigment Green 36 alone, C.I. Pigment Green 37 alone or a mixture consisting of at least one member of C.I. Pigment Green 7, C.I. Pigment Green 36, C.I. Pigment Green 37, C.I. Pigment Green 136 and C.I. Pigment Yellow 83 or C.I. Pigment Yellow 139. Other suitable green pigments are C.I. Pigment Green 15 and 25.

Examples for suitable blue pigments are phthalocyanine type pigments, used either alone or in combination with an dioxazine type violet pigment, for instance, a combination of C.I. Pigment Blue 15:3 and C.I. Pigment Violet 23. Further examples for blue pigments are such of C.I. Blue 15:3, 15:4, 15:6, 16 and 60, i.e. Phthalocyanine CI Pigment Blue 15:3, or Phthalocyanine C.I. Pigment Blue 15:6. Other suitable pigments are such of C.I. Pigment Blue 22, 28, C.I. Pigment Violet 14, 19, 23, 29, 32, 37, 177 and C.I. Orange 73.

The pigment of the black matrix photopolymeric composition preferably comprises at least one member selected from the group consisting of carbon, titanium black and iron oxide. However, a mixture of other pigments which, in total, give the black appearance, can also be used. For example, also C.I. Pigment Black 1 and 7 can be used alone or in combination.

For any color, combinations of more than two pigments can also be used. Especially suitable in color filter applications are powdery processed pigments prepared by finely dispersing the above mentioned pigments into a resin.

The concentration of the pigment in the total solid component (pigments of various colors and resin) is for example in the range of 5% to 80% by weight, for example 10% to 50% by weight, in particular in the range of 20% to 45% by weight.

The pigments in the color filter resist composition have preferably a mean particle diameter smaller than the wavelength of visible light (400 nm to 700 nm). Particularly preferred is a mean pigment diameter of <100 nm.

If necessary, the pigments may be stabilized in the photosensitive composition by pretreatment of the pigments with a dispersant to improve the dispersion stability of the pigment in the liquid formulation.

Examples for color filter resists, the composition of such resists and the processing conditions are given by T. Kudo et al., Jpn. J. Appl. Phys. Vol. 37 (1998) 3594; T. Kudo et al., J. Photopolym. Sci. Technol. Vol 9 (1996) 109; K. Kobayashi, Solid State Technol. November 1992, p. S15-S18; U.S. Pat. No. 5,368,976; U.S. Pat. No. 5,800,952; U.S. Pat. No. 5,882,843; U.S. Pat. No. 5,879,855; U.S. Pat. No. 5,866,298; U.S. Pat. No. 5,863,678; JP 06-230212-A; EP 320264; JP 09-269410-A; JP 10-221843-A; JP 01-090516-A; JP 10-171119-A, U.S. Pat. No. 5,821,016, U.S. Pat. No. 5,847,015, U.S. Pat. No. 5,882,843, U.S. Pat. No. 5,719,008, EP 881541, or EP 902327.

The photoinitiators of the present invention can be used in color filter resists, for example, such as those given as examples above, or can partially or fully replace the known photoinitiators in such resists. It is understood by a person skilled in the art that the use of the new photoinitiators of the present invention is not limited to the specific binder resins, crosslinkers and formulations of the color filter resist examples given hereinbefore but can be used in conjunction with any radically polymerizable component in combination with a dye or color pigment or latent pigment to form a photosensitive color filter ink or color filter resist.

Accordingly, subject of the invention also is a color filter prepared by providing red, green and blue (RGB) color elements and, optionally a black matrix, all comprising a photosensitive resin and a pigment on a transparent substrate and providing a transparent electrode either on the surface of the substrate or on the surface of the color filter layer, wherein said photosensitive resin comprises a polyfunctional acrylate monomer, an organic polymer binder and a photopolymerization initiator of formula I or II as described above. The monomer and binder components, as well as suitable pigments are as described above. In the manufacture of color filters the transparent electrode layer can either be applied on the surface of the transparent substrate or can be provided on the surface of the red, green and blue picture elements and the black matrix. The transparent substrate is for example a glass substrate which can additionally have an electrode layer on its surface. It is preferred to apply a black matrix between the color areas of different color in order to improve the contrast of a color filter.

Instead of forming a black matrix using a photosensitive composition and patterning the black photosensitive composition photolithographically by patternwise exposure (i.e. through a suitable mask) to form the black pattern separating the red green and blue colored areas on the transparent substrate it is alternatively possible to use an inorganic black matrix. Such inorganic black matrix can be formed from deposited (i.e. sputtered) metal (i.e. chromium) film on the transparent substrate by a suitable imaging process, for example utilizing photolithographic patterning by means of an etch resist, etching the inorganic layer in the areas not protected by the etch resist and then removing the remaining etch resist.

There are different methods known how and at which step in the color filter manufacturing process the black matrix can be applied. It can either be applied directly on the transparent substrate prior to formation of the red, green and blue (RGB) color filter as already mentioned above, or it can be applied after the RGB color filter is formed on the substrate.

In a different embodiment of a color filter for a liquid crystal display, according to U.S. Pat. No. 5,626,796, the black matrix can also be applied on the substrate opposite to the RGB color filter element-carrying substrate, which is separated from the former by a liquid crystal layer.

If the transparent electrode layer is deposited after applying the RGB color filter elements and—optionally—the black matrix, an additional overcoat film as a protective layer can be applied on the color filter layer prior to deposition of the electrode layer, for example, as described in U.S. Pat. No. 5,650,263.

To form an overcoat layer of a color filter, photosensitive resin or thermosetting resin compositions are employed. The photosensitive composition of the present invention can also be used to form such overcoat layers, because a cured film of the composition is excellent in flatness, hardness, chemical and thermal resistance, transparency especially in a visible region, adhesion to a substrate, and suitability for forming a transparent conductive film, e.g., an ITO film, thereon. In the production of a protective layer, there has been a demand that unnecessary parts of the protective layer, for example on scribing lines for cutting the substrate and on bonding pads of solid image sensors should be removed from the substrate as described in JP 57-42009-A, JP 1-130103-A and JP 1-134306-A. In this regard, it is difficult to selectively form a protective layer with good precision using the above-mentioned thermosetting resins. The photosensitive composition, however, allows to easily remove the unnecessary parts of the protective layer by photolithography.

It is obvious to those skilled in the art, that the photosensitive compositions of the present invention can be used for generating red, green and blue color pixels and a black matrix, for the manufacture of a color filter, regardless of the above described differences in processing, regardless, of additional layers which can be applied and regardless of differences in the design of the color filter. The use of a composition according to the present invention to form colored elements shall not be regarded as limited by different designs and manufacturing processes of such color filters.

As the compound (A) used in the color filter resist composition, which is soluble in an alkaline aqueous solution and insoluble in water, for example, a homopolymer of a polymerizable compound having one or more acid groups and one or more polymerizable unsaturated bonds in the molecule, or a copolymer of two or more kinds thereof, and a copolymer of one or more polymerizable compounds having one or more unsaturated bonds copolymerizable with these compounds and containing no acid group, can be used. Such compounds can be obtained by copolymerizing one or more kinds of a low molecular compound having one or more acid groups and one or more polymerizable unsaturated bonds in the molecule with one or more polymerizable compounds having one or more unsaturated bonds copolymerizable with these compounds and containing no acid group. Examples of acids groups are, a —COOH group, a —$SO_3H$ group, a —$SO_2$NHCO— group, a phenolic hydroxy group, a —$SO_2$NH— group, and a —CO—NH—CO— group. Among those, a high molecular compound having a —COOH group is particularly preferred.

Preferably, the organic polymer binder as a compound (A) in the color filter resist composition comprises an alkali soluble copolymer comprising, as addition polymerizable monomer units, at least an unsaturated organic acid compound such as acrylic acid, methacrylic acid and the like. It is preferred to use as a further co-monomer for the polymer binder an unsaturated organic acid ester compound such as methyl acrylate, ethyl (meth)acrylate, benzyl (meth)acrylate, styrene and the like to balance properties such as alkaline solubility, adhesion rigidity, chemical resistance etc.

The organic polymer binder can either be a random co-polymer or a block-co-polymer, for example, such as described in U.S. Pat. No. 5,368,976.

Examples of polymerizable compounds having one or more acid group and one or more polymerizable unsaturated bond in the molecule include the following compounds:

Acrylic acid, methacrylic acid, itaconic acid, crotonic acid, maleic acid, vinylbenzoic acid, and cinnamic acid are examples of the polymerizable compounds having one or more —COOH groups and one or more polymerizable unsaturated bonds in a molecule.

Vinylbenzenesulfonic acid and 2-(meth)acrylamide-2-methylpropanesulfonic acid are examples of the polymerizable compounds having one or more —$SO_3H$ groups and one or more polymerizable unsaturated bonds.

N-methylsulfonyl (meth)acrylamide, N-ethylsulfonyl (meth)acrylamide, N-phenylsulfonyl (meth)acrylamide, and N-(p-methylphenylsulfonyl) (meth)acrylamide are examples of the polymerizable compounds having one or more —$SO_2$NHCO— groups and one or more polymerizable unsaturated bonds.

Examples of polymerizable compounds having one or more phenolic hydroxy groups and one or more polymerizable unsaturated bonds in a molecule include hydroxyphenyl (meth)acrylamide, dihydroxyphenyl (meth)acrylamide, hydroxyphenyl-carbonyloxyethyl (meth)acrylate, hydroxyphenyloxyethyl (meth)acrylate, hydroxyphenylthioethyl (meth)acrylate, dihydroxyphenylcarbonyloxyethyl (meth)acrylate, dihydroxyphenyloxyethyl (meth)acrylate, and dihydroxy-phenylthioethyl (meth)acrylate.

Examples of the polymerizable compound having one or more —SO$_2$NH— groups and one or more polymerizable unsaturated bonds in the molecule include compounds represented by formula (a) or (b):

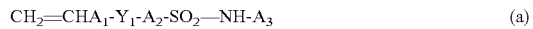

$$CH_2=CHA_1-Y_1-A_2-SO_2-NH-A_3 \quad (a)$$

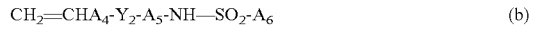

$$CH_2=CHA_4-Y_2-A_5-NH-SO_2-A_6 \quad (b)$$

wherein $Y_1$ and $Y_2$ each represents —COO—, —CONA$_7$-, or a single bond; $A_1$ and $A_4$ each represents H or $CH_3$; $A_2$ and $A_5$ each represents $C_1$-$C_{12}$alkylene optionally having a substituent, cycloalkylene, arylene, or aralkylene, or $C_2$-$C_{12}$alkylene into which an ether group and a thioether group are inserted, cycloalkylene, arylene, or aralkylene; $A_3$ and $A_6$ each represents H, $C_1$-$C_{12}$alkyl optionally having a substituent, a cycloalkyl group, an aryl group, or an aralkyl group; and $A_7$ represents H, $C_1$-$C_{12}$alkyl optionally having a substituent, a cycloalkyl group, an aryl group, or an aralkyl group.

The polymerizable compounds having one or more —CO—NH—CO— group and one or more polymerizable unsaturated bond include maleimide and N-acryloyl-acrylamide. These polymerizable compounds become the high molecular compounds comprising a —CO—NH—CO— group, in which a ring is formed together with a primary chain by polymerization. Further, a methacrylic acid derivative and an acrylic acid derivative each having a —CO—NH—CO— group can be used as well. Such methacrylic acid derivatives and the acrylic acid derivatives include, for example, a methacrylamide derivative such as N-acetylmethacrylamide, N-propionylmethacrylamide, N-butanoylmethacrylamide, N-pentanoylmethacrylamide, N-decanoylmethacrylamide, N-dodecanoylmethacrylamide, N-benzoylmethacrylamide, N-(p-methylbenzoyl)methacryl-amide, N-(p-chlorobenzoyl)methacrylamide, N-(naphthyl-carbonyl)methacrylamide, N-(phenylacetyl)-methacryl-amide, and 4-methacryloylaminophthalimide, and an acrylamide derivative having the same substituent as these. These polymerizable compounds polymerize to be compounds having a —CO—NH—CO— group in a side chain.

Examples of polymerizable compounds having one or more polymerizable unsaturated bond and containing no acid group include a compound having a polymerizable unsaturated bond, selected from (meth)acrylates, (meth)acrylamides, an allyl compound, vinyl ethers, vinyl esters, styrenes, and crotonates, and specifically, include (meth)acrylates such as alkyl (meth)acrylate or substituted alkyl (meth)acrylate (for example, methyl (meth)acrylate, ethyl (meth)acrylate, propyl (meth)acrylate, isopropyl (meth)acrylate, butyl (meth)acrylate, amyl (meth)acrylate, hexyl (meth)acrylate, cyclohexyl (meth)acrylate, ethylhexyl (meth)acrylate, octyl (meth)acrylate, t-octyl (meth)acrylate, chloro-ethyl (meth)acrylate, allyl (meth)acrylate, 2-hydroxy-ethyl (meth)acrylate, 2-hydroxypropyl (meth)acrylate, 4-hydroxybutyl (meth)acrylate, 2,2-dimethyl-3-hydroxy-propyl (meth)acrylate, 5-hydroxypentyl (meth)acrylate, trimethylolpropane mono (meth)acrylate, pentaerythritol mono (meth)acrylate, benzyl (meth)acrylate, methoxy-benzyl (meth)acrylate, chlorobenzyl (meth)acrylate, furfuryl (meth)acrylate, tetrahydrofurfuryl (meth)acrylate, phenoxyethyl (meth)acrylate, and aryl (meth)acrylate (for example, phenyl (meth)acrylate, cresyl (meth)acrylate, and naphthyl (meth)acrylate); (meth)acrylamides such as (meth)acryl-amide, N-alkyl(meth)acrylamide (the alkyl group includes, for example, methyl, ethyl, propyl, butyl, t-butyl, heptyl, octyl, ethylhexyl, cyclohexyl, hydroxyethyl, and benzyl), N-aryl(meth)acrylamide (the aryl group includes, for example, phenyl, tolyl, nitrophenyl, naphthyl, and hydroxyphenyl), N,N-dialkyl(meth)acryl-amide (the alkyl group includes, for example, methyl, ethyl, butyl, isobutyl, ethylhexyl, and cyclohexyl), N,N-diaryl (meth)acrylamide (the aryl group includes, for example, phenyl), N-methyl-N-phenyl (meth)acryl-amide, N-hydroxyethyl-N-methyl (meth)acrylamide, N-2-acetoamidethyl-N-acetyl (meth)acrylamide, N-(phenyl-sulfonyl)(meth)acrylamide, and N-(p-methylphenyl-sulfonyl)(meth)acrylamide;

an allyl compound such as allyl esters (for example, allyl acetate, allyl caproate, allyl caprylate, allyl laurate, allyl palmitate, allyl stearate, allyl benzoate, allyl acetoacetate, and allyl lactate), and allyloxyethanol;

vinyl ethers such as alkyl vinyl ether (the alkyl group includes, for example, hexyl, octyl, decyl, ethylhexyl, methoxyethyl, ethoxyethyl, chloroethyl, 1-methyl-2,2-dimethylpropyl, 2-ethylbutyl, hydroxyethyl, hydroxyethoxyethyl, dimethylaminoethyl, diethylamino-ethyl, butylaminoethyl, benzyl, and tetrahydrofurfuryl), and vinyl aryl ether (the aryl group includes, for example, phenyl, tolyl, chlorophenyl, 2,4-dichloro-phenyl, naphthyl, and anthranyl);

vinyl esters such as vinyl butylate, vinyl isobutylate, vinyl trimethylacetate, vinyl diethyl-acetate, vinyl barate, vinyl caproate, vinyl chloro-acetate, vinyl dichloroacetate, vinyl methoxyacetate, vinyl butoxyacetate, vinyl phenylacetate, vinyl aceto-acetate, vinyl lactate, vinyl-b-phenylbutylate, vinyl cyclohexylcarboxylate, vinyl benzoate, vinyl salicylate, vinyl chlorobenzoate, vinyl tetrachlorobenzoate, and vinyl naphthoate;

styrenes such as styrene, alkylstyrene (for example, methylstyrene, dimethylstyrene, trimethyl-styrene, ethylstyrene, diethylstyrene, isopropylstyrene, butylstyrene, hexylstyrene, cyclohexylstyrene, decyl-styrene, benzylstyrene, chloromethylstyrene, trifluoro-methylstyrene, ethoxymethylstyrene, and acetoxymethyl-styrene), alkoxystyrene (for example, methoxystyrene, 4-methoxy-3-methylstyrene, and dimethoxystyrene), and halogenostyrene (for example, chlorostyrene, dichlorostyrene, trichlorostyrene, tetrachlorostyrene, penta-chlorostyrene, bromostyrene, dibromostyrene, iodostyrene, fluorostyrene, trifluorostyrene, 2-bromo-4-trifluoromethylstyrene, and 4-fluoro-3-trifluoromethyl-styrene);

crotonates such as alkyl crotonate (for example, butyl crotonate, hexyl crotonate, and glycerine monocrotonate);

dialkyl itaconates (for example, dimethyl itaconate, diethyl itaconate, and dibutyl itaconate);

dialkyl maleates or fumarates (for example, dimethyl maleate and dibutyl fumarate); and (meth)acrylonitrile.

There can be used as well hydroxystyrene homo- or copolymers or a novolak type phenol resin, for example, poly (hydroxystyrene) and poly(hydroxystyrene-co-vinylcyclohexanol), a novolak resin, a cresol novolak resin, and a halogenated phenol novolak resin. More specifically, it includes, for example, the methacrylic acid copolymers, the acrylic acid copolymers, the itaconic acid copolymers, the crotonic acid copolymers, the maleic anhydride copolymers, for example, with styrene as a co-monomer, and maleic acid copolymers, and partially esterified maleic acid copolymers each described in, for example, JP 59-44615-B4 (the term "JP-B4" as used herein means an examined Japanese patent publication), JP 54-34327-B4, JP 58-12577-B4, and JP 54-25957-B4, JP 59-53836-A, JP 59-71048-A, JP 60-159743-A, JP 60-258539-A, JP 1-152449-A, JP 2-199403-A, and JP 2-199404-A, and which copolymers can be further reacted with an amine, as e.g disclosed in U.S. Pat. No. 5,650,263; further, a cellulose derivative having a carboxyl group on a side chain can be used, and particularly preferred are copolymers of benzyl (meth)acrylate and (meth)acrylic acid and copolymers of benzyl (meth)acrylate, (meth)acrylic acid and other monomers, for example as described in U.S. Pat. No. 4,139,391, JP 59-44615-B4, JP 60-159743-A and JP 60-258539-A.

With respect to those having carboxylic acid groups among the above organic binder polymers, it is possible to react some or all of the carboxylic acid groups with glycidyl(meth)acrylate or an epoxy(meth)acrylate to obtain photopolymerizable organic binder polymers for the purpose of improving the photosensitivity, coating film strength, the coating solvent and chemical resistance and the adhesion to the substrate. Examples are disclosed in, JP 50-34443-B4 and JP 50-34444-B4, U.S. Pat. No. 5,153,095, by T. Kudo et al. in J. Appl. Phys., Vol. 37 (1998), p. 3594-3603, U.S. Pat. No. 5,677,385, and U.S. Pat. No. 5,650,233.

The weight-average molecular weight of the binders is preferably 500 to 1,000,000, e.g. 3,000 to 1,000,000, more preferably 5,000 to 400,000.

These compounds may be used singly or as a mixture of two or more kinds. The content of the binder in the light-sensitive resin composition is preferably 10 to 95 weight %, more preferably 15 to 90 weight % based on the whole solid matters.

As compound (C) the color filter resist composition according to the present invention contains additionally at least one addition-polymerizable monomeric compound.

For example, the following compounds can be used singly or in combination with the other monomers as the addition-polymerizable monomer having an ethylenically unsaturated double bond used in the present invention. Specifically, they include t-butyl(meth)acrylate, ethylene glycol di(meth)acrylate, 2-hydroxypropyl (meth)acrylate, triethylene glycol di(meth)acrylate, trimethylolpropane tri(meth)acrylate, 2-ethyl-2-butylpropanediol di(meth)acrylate, pentaerythritol tri(meth)acrylate, pentaerythritol tetra(meth)acrylate, dipentaerythritol hexa(meth)acrylate, dipentaerythritol penta(meth)acrylate, polyoxyethylated trimethylolpropane tri(meth)acrylate, tris(2-(meth)acryloyloxyethyl)isocyanurate, 1,4-diisopropenyl-benzene, 1,4-dihydroxybenzene (meth)acrylate, decamethylene glycol di(meth)acrylate, styrene, diallyl fumarate, triallyl trimellitate, lauryl (meth)acrylate, (meth)acrylamide, and xylenebis(meth)acrylamide. Further, there can be used a reaction product of a compound having a hydroxyl group, such as 2-hydroxyethyl (meth)acrylate, 2-hydroxypropyl (meth)acrylate, and polyethylene glycol mono(meth)acrylate with diisocyanate such as hexamethylenediisocyanate, toluenediisocyanate, and xylenediisocyanate. Particularly preferred are pentaerythritol tetraacrylate, dipentaerythritol hexaacrylate, dipenta-erythritol pentaacrylate, and tris(2-acyloyloxyethyl)-isocyanurate.

In a color filter resist composition the whole amount of the monomers contained in the photopolymerizable composition is preferably 5 to 80% by weight, in particular 10 to 70% by weight based on the whole solid components of the composition.

Further, in the color filter the total solid component of each color may contain an ionic impurity-scavenger, e.g. an organic compound having an epoxy group. The concentration of the ionic impurity scavenger in the total solid component generally is in the range from 0.1% by weight to 10% by weight.

Examples of color filters, especially with respect to the above described combinations of pigments and ionic impurity scavenger are given in EP 320264. It is understood, that the photoinitiators according to the present invention, i.e. the compounds of the formula I and II in the color filter formulations described in EP 320264 can replace the triazine initiator compounds.

The compositions according to this invention can comprise additionally a crosslinking agent which is activated by an acid, for example as described in JP 10 221843-A, and a compound which generates acid thermally or by actinic radiation and which activates a crosslinking reaction.

The compositions according to this invention can also comprise latent pigments which are transformed into finely dispersed pigments during the heat treatment of the latent pigment containing photosensitive pattern or coating. The heat treatment can be performed after exposure or after development of the latent pigment-containing photoimageable layer. Such latent pigments are soluble pigment precursors which can be transformed into insoluble pigments by means of chemical, thermal, photolytic or radiation induced methods as described, for example, in U.S. Pat. No. 5,879,855. This transformation of such latent pigments can be enhanced by adding a compound which generates acid at actinic exposure or by adding an acidic compound to the composition. Therefore, a color filter resist can also be prepared, which comprises a latent pigment in a composition according to this invention.

Following the coating of the substrates, the solvent is removed, generally by drying, to leave an essentially dry resist film of the photoresist on the substrate.

The photosensitive composition of the present invention can suitably be used for forming a color filter but will not be limited to this application. It is useful as well for other applications, e.g. recording materials, photoresists, displays, display elements, paints, and printing inks.

The photosensitive compositions according to the invention are also suitable for manufacturing interlayer insulating layers or dielectric layers in a liquid crystal display, and more particularly in a reflection type liquid crystal display including an active matrix type display having a thin film transistor (TFT) as a switching device, and a passive matrix type without a switching device.

In recent years, liquid crystal displays have, for example, been widely used for pocket-type TV sets and terminal devices for communication by virtue of its small thickness and light weight. A reflection type liquid crystal display without necessity of using a back light is in particular in demand because it is ultra-thin and light-weight, and it can significantly reduce power consumption. However, even if a back light is removed out of a presently available transmission type color liquid crystal display and a light reflection plate is added to a lower surface of the display, it would cause a problem in that the efficiency of utilizing lights is low, and it is not possible to have practical brightness.

As a solution to this problem, there have been suggested various reflection type liquid crystal displays for enhancing an efficiency of utilizing lights. For instance, a certain reflection type liquid crystal display is designed to include a pixel electrode having reflection function.

The reflection type liquid crystal display includes an insulating substrate and an opposing substrate spaced away from the insulating substrate. A space between the substrates is filled with liquid crystals. A gate electrode is formed on the insulating substrate, and both the gate electrode and the insulating substrate are covered with a gate insulating film. A semiconductor layer is then formed on the gate insulating film above the gate electrode. A source electrode and a drain electrode are also formed on the gate insulating film in contact with the semiconductor layer. The source electrode, the drain electrode, the semiconductor layer, and the gate electrode cooperate with one another to thereby constitute a bottom gate type TFT as a switching device.

An interlayer insulating film is formed covering the source electrode, the drain electrode, the semiconductor layer, and the gate insulating film therewith. A contact hole is formed throughout the interlayer insulating film on the drain electrode. A pixel electrode made of aluminum is formed on both the interlayer insulating film and an inner sidewall of the contact hole. The drain electrode of the TFT is eventually in contact with the pixel electrode through the interlayer insulating film. The interlayer insulating layer is generally designed to have a roughened surface by which the pixel electrode acts as a reflection plate which diffuses lights to get a wider angle for viewing (angle of visibility).

The reflection type liquid crystal display remarkably enhances an efficiency of using lights by virtue that the pixel electrode acts as a light reflection plate.

In the above-mentioned reflection type liquid crystal display, the interlayer insulating film is designed to have projections and recesses by photolithography. To form and control a fine shape of the projections and recesses in micrometer order for surface roughness and to form contact holes, photolithography methods using positive and negative photoresists are used. For these resists the compositions according to the invention are especially suitable.

The photosensitive compositions according to the invention can further be used for manufacturing spacers, which control a cell gap of the liquid crystal part in liquid crystal display panels. Since the properties of light transmitted or reflected through the liquid crystal layer in a liquid crystal display are dependent on the cell gap, the thickness accuracy and uniformity over the pixel array are critical parameters for the performance of the liquid crystal display unit. In a liquid crystal cell, the spacing between the substrates in the cell is maintained constant by sparsely distributing glass or polymer spheres about several micrometers in diameter as spacers between the substrates. The spacers are thus held between the substrates to maintain the distance between the substrates at a constant value. The distance is determined by the diameter of the spacers. The spacers assure the minimum spacing between the substrates; i.e., they prevent a decrease in distance between the substrates. However, they cannot prevent the substrates from being separated apart from each other, i.e., the increase in distance between the substrates. Additionally, this method of using spacer beads has problems of the uniformity in the diameter of spacer beads and difficulty in the even dispersion of spacer beads on the panel, as well as nonuniform orientation and decrease in brightness and/or optical aperture depending on the location of spacers on pixel array region. Liquid crystal displays having a large image display area have recently been attracting much attention. However, the increase in the area of a liquid crystal cell generally produces the distortion of the substrates constituting the cell. The layer structure of the liquid crystal tends to be destroyed due to the deformation of the substrate. Thus, even when spacers are used for maintaining the spacing between the substrates constant, a liquid crystal display having a large image display area is unfeasible because the display experiences disturbances. Instead of the above spacer sphere dispersion method, a method of forming columns in the cell gap as spacers has been proposed. In this method, columns of a resin are formed as spacers in the region between the pixel array region and the counter electrode to form a prescribed cell gap. Photosensitive materials having adhesive properties with photolithography are commonly used, for instance, in the manufacturing process of color filters. This method is advantageous compared with the conventional method using spacer beads in the points that location, number and height of the spacers may be controlled freely. In a color liquid crystal display panel, such spacers are formed in the nonimaging area under black matrix of color filter elements. Therefore, the spacers formed using photosensitive compositions do not decrease brightness and optical aperture.

Photosensitive compositions for producing protective layer with spacers for color filters are disclosed in JP 2000-81701-A and dry film type photoresists for spacer materials are also disclosed in JP 11-174459-A and JP 11-174464-A. As described in the documents, the photosensitive compositions, liquid and dry film photoresists, are comprising at least an alkaline or acid soluble binder polymer, a radically polymerizable monomer, and a radical initiator. In some cases, thermally crosslinkable components such as epoxide and carboxylic acid may additionally be included.

The steps to form spacers using a photosensitive composition are as follows:

a photosensitive composition is applied to the substrate, for instance a color filter panel and after the substrate is prebaked, it is exposed to light through a mask. Then, the substrate is developed with a developer and patterned to form the desired spacers. When the composition contains some thermosetting components, usually a postbaking is carried out to thermally cure the composition.

The photocurable compositions according to the invention are suitable for producing spacers for liquid crystal displays (as described above) because of their high sensitivity.

The photosensitive compositions according to the invention are also suitable for manufacturing microlens arrays used in liquid crystal display panels, image sensors and the like. Microlenses are microscopic passive optical components that fit on active optoelectronic devices such as detectors, displays, and light emitting devices (light-emitting diodes, transversal and vertical cavity lasers) to improve their optical input or output quality. The areas of applications are wide and cover areas such as telecommunications, information technology, audio-visual services, solar cells, detectors, solid-state light sources, and optical interconnects.

Present optical systems use a variety of techniques to obtain efficient coupling between microlenses and microoptical devices.

The microlens arrays are used for condensing illuminating light on the picture element regions of a nonluminescent display device, such as a liquid crystal display devices, to increase the brightness of the display, for condensing incident light or as a means for forming an image on the photoelectric conversion regions of a line image sensor used for example in facsimiles and the like to improve the sensitivity of these devices, and for forming an image to be printed on a photosensitive means used in liquid crystal printers or light emitting diode (LED) printers.

The most common application is their use to improve the efficiency of photodetector arrays of a solid-state image sensing device such as a charge coupled device (CCD). In a detector array, the collection of as much light as possible in each detector element or pixel is wanted. If a microlens is put on top of each pixel, the lens collects incoming light and focuses it onto an active area that is smaller than the size of the lens.

According to the prior-art, microlens arrays can be produced by a variety of methods;

(1) A method for obtaining convex lenses wherein a pattern of the lenses in a planar configuration is drawn on a thermoplastic resin by a conventional photolithographic technique or the like, and then the thermoplastic resin is heated to a temperature above the softening point of the resin to have flowability, thereby causing a sag in the pattern edge (so called "reflowing") (see, e.g., JP 60-38989-A, JP 60-165623-A, JP 61-67003-A, and JP 2000-39503-A). In this method, when the thermoplastic resin used is photosensitive, a pattern of the lenses can be obtained by exposure of this resin to light.

(2) A method for forming a plastic or glass material by the use of a mold or a stamper. As lens material, a photocurable resin and a thermosetting resin can be used in this method (see, e.g., WO99/38035).

(3) A method for forming convex lenses on the basis of a phenomenon in which when a photosensitive resin is exposed to light in a desired pattern by the use of an aligner, unreacted monomers move from the unexposed regions to the exposed regions, resulting in a swell of the exposed regions (see, e.g., Journal of the Research Group in Microoptics Japanese Society of Applied Physics, Colloquium in Optics, Vol. 5, No. 2, pp. 118-123 (1987) and Vol. 6, No. 2, pp. 87-92(1988)).

On the upper surface of a supporting substrate, a photosensitive resin layer is formed. Thereafter, with the use of a separate shading mask, the upper surface of the photosensitive resin layer is illuminated with light from a mercury lamp or the like, so that the photosensitive resin layer is exposed to the light. As a result, the exposed portions of the photosensitive resin layer swell into the shape of convex lenses to form the light condensing layer having a plurality of microlens.

(4) A method for obtaining convex lenses wherein a photosensitive resin is exposed to light by a proximity exposure technique in which a photomask is not brought into contact with the resin, to cause a blur at the pattern edge, so that the amount of photochemical reaction products is distributed depending upon the degree of blurring at the pattern edge (see, e.g., JP 61-153602-A).

(5) A method for generating a lens effect wherein a photosensitive resin is exposed to light with a particular intensity distribution to form a distribution pattern of refractive index depending upon the light intensity (see, e.g., JP 60-72927-A and JP 60-166946-A).

The photosensitive compositions according to the invention can be used in any one of the above-mentioned methods to form microlens arrays using photocurable resin compositions. A particular class of techniques concentrates on forming microlenses in thermoplastic resins like photoresist. An example is published by Popovic et al. in the reference SPIE 898, pp. 23-25 (1988). The technique, named reflow technique, comprises the steps of defining the lenses' footprint in a thermoplastic resin, e.g. by photolithography in a photosensitive resin like a photoresist, and subsequently heating this material above its reflow temperature. The surface tension draws the island of photoresist into a spherical cap with a volume equal to the original island before the reflow. This cap is a piano-convex microlens. Advantages of the technique are, amongst others, the simplicity, the reproducibility, and the possibility of integration directly on top of a light-emitting or light-detecting optoelectronic device. In some cases, an overcoat layer is formed on the patterned lens units with a rectangular shape prior to reflowing to avoid a sagging of the island of the resin in the middle without reflow into a spherical cap in the reflow step. The overcoat acts as a permanent protective layer. The coating layer is also made of a photosensitive composition.

Microlens arrays can also be fabricated by the use of a mold or a stamper as, for example, disclosed in EP 932256. A process of manufacturing the planar microlens array is as follows: a release agent is coated on a shaping surface of a stamper on which convex portions are densely arranged, and a photocurable synthetic resin material having a high refractive index is set on the shaping surface of the stamper. Next, the base glass plate is pushed onto the synthetic resin material, thereby spreading the synthetic resin material, and the synthetic resin material is cured by irradiating with ultraviolet radiation or by heating and is shaped to form the convex microlenses. Thereafter the stamper is peeled off. Then, a photocurable synthetic resin material having a low refractive index is additionally coated onto the convex microlenses as an adhesive layer and a glass substrate which is made into a cover glass plate is pushed onto the synthetic resin material, thereby spreading the same. The synthetic resin material is then cured and finally the planar microlens array is formed. As disclosed in U.S. Pat. No. 5,969,867, a similar method using a mold is applied for the production of a prism sheet, which is used as a part of backlight units for color liquid crystal display panels to enhance the brightness. A prism sheet forming a prism row on one side is mounted on the light-emitting surface of the backlight. For fabricating a prism sheet, an active energy ray-curable composition is cast and spread in a lens mold which is made of metal, glass or resin and forms the lens shape of the prism row, etc., after which a transparent substrate sheet is placed onto it and active energy rays from an active energy ray-emitting source are irradiated through the sheet for curing. The prepared lens sheet is then released from the lens mold to obtain the lens sheet.

The active energy ray-curable composition used to form the lens section must have a variety of properties, including adhesion to the transparent substrate, and suitable optical characteristics.

Lenses at least with some photoresists in the prior art are not desirable for some applications since the optical transmittance in the blue end of the optical spectrum is poor. Because the photocurable compositions according to the invention have low yellowing properties, both thermally and photochemically, they are suitable for the production of microlens arrays as described above.

The novel radiation-sensitive compositions are also suitable for photo-lithographic steps used in the production process of plasma display panels (PDP), particularly for the imaging forming process of barrier rib, phosphor layer and electrodes.

The PDP is a planar display for displaying images and information by virtue of the emission of light by gas discharge. By the construction of panel and the method of operation, it is known in two types, i.e. DC (direct current) type and AC (alternating current) type. By way of example, the principle of the DC type color PDP will be briefly explained. In the DC type color PDP, the space intervening between two transparent substrates (generally glass plates) is divided into numerous minute cells by latticed barrier ribs interposed between the transparent substrates. In the individual cells a discharge gas, such as He or Xe, is sealed. On the rear wall of each cell there is a phosphor layer which, on being excited by the ultraviolet light generated by the discharge of the discharge gas, emits visible light of three primary colors. On the inner faces of the two substrates, electrodes are disposed as opposed to each other across the relevant cells. Generally, the cathodes are formed of a film of transparent electroconductive material such as NESA glass. When a high voltage is applied between these electrodes formed on the fore wall and the rear wall, the discharge gas which is sealed in the cells induces plasma discharge and, by virtue of the ultraviolet light radiated consequently, incites the fluorescent elements of red, blue, and green colors to emit lights and effect the display of an image. In the full-color display system, three fluorescent elements severally of the three primary colors of red, blue, and green mentioned above jointly form one picture element.

The cells in the DC type PDP are divided by the component barrier ribs of a lattice, whereas those in the AC type PDP are divided by the barrier ribs which are arranged parallel to each other on the faces of the substrates. In either case, the cells are divided by barrier ribs. These barrier ribs are intended to confine the luminous discharge within a fixed area to preclude false discharge or cross talk between adjacent discharge cells and ensure ideal display.

The novel composition also relates to a photosensitive thermosetting resin composition and a method of forming a solder resist pattern by the use thereof, and more particularly relates to a novel photosensitive thermosetting resin composition useful as materials for the production of printed circuit boards, the precision fabrication of metallic articles, the etching of glass and stone articles, the relief of plastic articles, and the preparation of printing plates and particularly useful as a solder resist for printed circuit boards and to a method of forming a solder resist pattern by the steps of exposing a layer of the resin composition selectively to an actinic ray through a photomask having a pattern and developing the unexposed part of the layer.

The solder resist is a substance which is used during the soldering of a given part to a printed circuit board for the purpose of preventing molten solder from adhering to irrelevant portions and protecting circuits. It is, therefore, required to possess such properties as high adhesion, insulation resistance, resistance to soldering temperature, resistance to solvents, resistance to alkalis, resistance to acids, and resistance to plating.

Subject of the invention also is a solder resist comprising a composition as described above.

Preferred is the use of the compositions, comprising thermosetting elements described as compound (E) according to the invention, in an image-forming process, e.g. a process for the preparation of solder masks, wherein (1) the components of the composition as described above are mixed (2) the resulting composition is applied to the substrate ("coating of the substrate")

(3) the solvent, if present, is evaporated, at elevated temperature, e.g. at a temperature between 80-90° C.

(4) the coated substrate is patternwise exposed to electromagnetic radiation through a negative mask (thereby initiating the reaction of the acrylate)

(5) the irradiated sample is developed, by washing with aqueous alkaline solution and thereby removing the uncured areas and (6) the sample is thermally cured, e.g. at a temperature of about 150° C.

This process is another object of the invention.

The heating step (6) usually is carried out at temperatures >100° C. and <200° C., preferably at temperatures of 130-170° C., e.g. at 150° C.

The examples which follow illustrate the invention in more detail. Parts and percentages are, as in the remainder of the description and in the claims, by weight, unless stated otherwise. Where alkyl radicals having more than three carbon atoms are referred to without any mention of specific isomers, the n-isomers are meant in each case.

EXAMPLE 1

Synthesis of 2,5-Dimethoxybenzaldehyde Oxime-O-acetate

In formula (I):

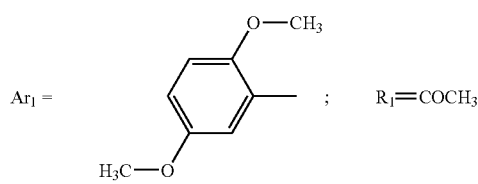

1.a 2,5-Dimethoxybenzaldehyde Oxime

To 16.6 g (99.9 mmol) of 2,5-dimethoxybenzaldehyde in ethanol (100 mL) is added a mixture of 7.64 g (169 mmol) of $H_2NOH$—HCl and 13.9 g (169 mmol) of sodium acetate in 50 mL of $H_2O$. This reaction mixture is heated to reflux for 2.5 h. After adding $H_2O$ to dissolve the precipitated inorganic salt, ethanol is removed by evaporation in vacuo. The resulting white solid is filtered off and washed with $H_2O$. 14.9 g of white solid are obtained (82%). $^1$H-NMR ($CDCl_3$). δ [ppm]: 3.79 (s, 3H), 3.82 (s, 3H), 6.85 (d, 1H), 6.92 (d, 1H), 7.25 (d, 1H), 8.00 (broad s, 1H), 8.47 (s, 1H).

1.b 2,5-Dimethoxybenzaldehyde Oxime-O-Acetate 2.00 g (11.0 mmol) of 2,5-Dimethoxybenzaldehyde oxime and 1.13 g (14.3 mmol) of acetyl chloride are dissolved in 15 mL of tetrahydrofuran (THF). To this solution are gradually added 1.67 g (16.5 mmol) of triethylamine at an ice-bath temperature. After completion of the addition, the reaction mixture is stirred at room temperature for 3 h, and then $H_2O$ is added to dissolve the resulting white solid. The crude product is extracted with ethyl acetate. This organic layer is washed twice with saturated $NaHCO_3$ aq. solution and with brine, followed by drying over anhydrous $MgSO_4$. The residue is applied to column chromatography on silica gel with ethyl acetate-hexane (1:4) as eluent. 2.03 g of white solid melting at 55-57° C. are obtained (83%). The structure is confirmed by the $^1$H-NMR spectrum ($CDCl_3$). δ [ppm]: 2.23 (s, 3H), 3.81 (s, 3H), 3.83 (s, 3H), 6.87 (d, 1H), 7.01 (dd, 1H), 7.47 (d, 1H), 8.75 (s, 1H).

EXAMPLES 2-30

The compounds of examples 2-30 are prepared according to the method described in example 1 from the corresponding aldehydes. The compounds and their $^1$H-NMR-data are given in table 1.

TABLE 1

| Example | structure | state/ mp [° C.] | $^1$H-NMR, δ [ppm] |
|---|---|---|---|
| 2 | (4-methoxy-1-naphthyl aldehyde O-acetyl oxime) | 99-101 | 2.27 (s, 3H), 4.05 (s, 3H), 6.84 (d, 1H), 7.54 (t, 1H), 7.65 (t, 1H), 7.81 (d, 1H), 8.33 (d, 1H), 8.64 (d, 1H), 8.85 (s, 1H) |
| 3 | (3,4-dimethoxybenzaldehyde O-acetyl oxime) | colorless liquid | 2.23 (s, 3H), 3.39 (s, 3H), 3.94 (s, 3H), 6.88 (d, 1H), 7.14 (d, 1H), 7.39 (s, 1H), 8.23 (s, 1H) |
| 4 | (4-methoxybenzaldehyde O-acetyl oxime) | colorless liquid | 2.22 (s, 3H), 3.85 (s, 3H), 6.93 (d, 2H), 7.69 (d, 2H), 8.30 (s, 1H) |
| 5 | (piperonal O-acetyl oxime) | 104-107 | 2.22 (s, 3H), 6.03 (s, 2H), 6.84 (d, 1H), 7.09 (d, 1H), 7.36 (s, 1H), 8.25 (s, 1H) |
| 6 | (2-methoxybenzaldehyde O-acetyl oxime) | colorless liquid | 2.22 (s, 3H), 3.87 (s, 3H), 6.92 (d, 1H), 6.98 (dd, 1H), 7.43 (dd, 1H), 7.97 (d, 1H), 8.77 (s, 1H) |
| 7 | (benzaldehyde O-acetyl oxime) | colorless liquid | 2.24 (s, 3H), 7.38-7.52 (m, 3H), 7.74 (d, 2H), 8.36 (s, 1H) |

TABLE 1-continued

| Example | structure | state/ mp [° C.] | $^1$H-NMR, δ [ppm] |
|---|---|---|---|
| 8 | | 54-56 | 2.25 (s, 3H), 2.47 (s, 3H), 7.21-7.26 (m, 2H), 7.36 (dt, 1H), 7.84 (d, 1H), 8.62 (s, 1H) |
| 9 | | 83-84 | 2.30 (s, 3H), 7.50-7.59 (m, 2H), 7.65 (t, 1H), 7.91 (d, 2H), 7.98 (d, 2H), 8.57 (d, 1H), 8.99 (s, 1H) |
| 10 | | 58-59 | 1.23 (t, 3H), 2.49 (q, 2H), 3.85 (s, 3H), 6.93 (d, 2H), 7.68 (d, 2H), 8.30 (s, 1H) |
| 11 | | 103-106 | 2.21 (s, 3H), 3.03 (s, 6H), 6.68 (d, 2H), 7.59 (d, 2H), 8.23 (s, 1H) |
| 12 | | 76-77 | 2.30 (s, 3H), 4.00 (s, 3H), 7.28 (d, 1H), 7.40 (td, 1H), 7.62 (td, 1H), 7.78 (dd, 1H), 7.96 (d, 1H), 9.04 (d, 1H), 9.15 (s, 1H) |

TABLE 1-continued
| Example | structure | state/ mp [° C.] | $^1$H-NMR, δ [ppm] |
|---|---|---|---|
| 13 | 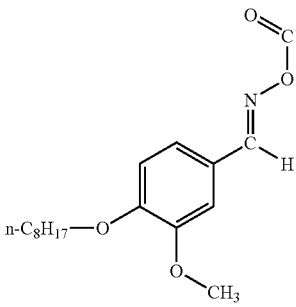 | 58-60 | 0.88 (t, 3H), 1.30 (m, 8H), 1.46 (tt, 2H), 1.86(tt,2H), 2.22 (s, 3H), 3.92 (s, 3H), 4.05 (t, 2H), 6.90 (d, 1H), 7.11 (dd, 1H), 7.38 (d, 1H), 8.27 (s, 1H) |
| 14 | 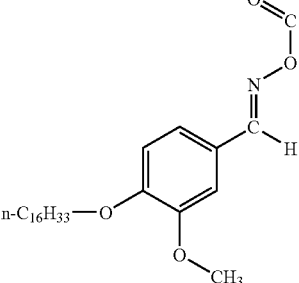 | 81-84 | 0.88 (t, 3H), 1.26 (m, 24H), 1.50 (m, 2H), 1.86(tt,2H), 2.22 (s, 3H), 3.92 (s, 3H), 4.05 (t, 2H), 6.87 (d, 1H), 7.11 (dd, 1H), 7.38 (d, 1H), 8.24 (s, 1H) |
| 15 | 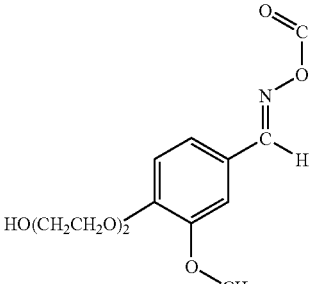 | 59-89 | 2.22 (s, 3H), 2.65 (br, 1H), 3.69 (m, 2H), 3.76 (br, 2H), 3.91 (s, 3H), 3.93 (t, 2H), 4.21 (t, 2H), 6.90 (d, 1H), 7.11 (dd, 1H), 7.39 (d, 1H), 8.27 (s, 1H) |
| 16 | 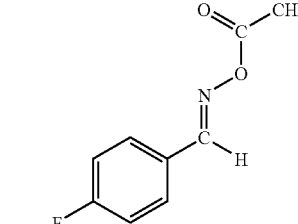 | 77-78 | 2.24 (s, 3H), 7.13 (dd, 2H), 7.74 (dd, 2H), 8.34 (s, 1H) |
| 17 | 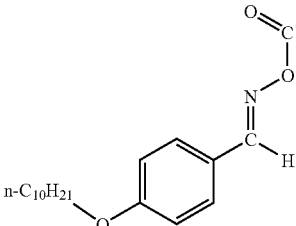 | 68-71 | 0.89 (t, 3H), 1.20-1.46 (m, 14H), 1.81 (m, 2H), 2.24 (s, 3H), 4.01 (t, 2H), 6.90 (d, 1H), 6.96 (t, 1H), 7.41 (td, 1H), 7.97 (dd, 1H), 8.77 (s, 1H) |

TABLE 1-continued

| Example | structure | state/mp [° C.] | $^1$H-NMR, δ [ppm] |
|---|---|---|---|
| 18 | (3,5-di-t-C$_4$H$_9$-4-C$_2$H$_5$O-C$_6$H$_2$)-CH=N-O-C(=O)-CH$_3$ | liquid | 1.42 (t, 3H), 1.42 (s, 18H), 2.23 (s, 3H), 3.76 (q, 2H), 7.57 (s, 2H), 8.29 (s, 1H) |
| 19 | (3,5-di-Br-4-C$_2$H$_5$O-C$_6$H$_2$)-CH=N-O-C(=O)-CH$_3$ | 77-79 | 1.50 (t, 3H), 2.24 (s, 3H), 4.13 (q, 2H), 7.90 (s, 2H), 8.21 (s, 1H) |
| 20 | (2-n-C$_{10}$H$_{21}$O-C$_6$H$_4$)-CH=N-O-C(=O)-CH$_3$ | liquid | 0.88 (t, 3H), 1.20-1.46 (m, 14H), 1.79 (m, 2H), 2.22 (s, 3H), 3.99 (t, 2H), 6.92 (dd, 2H), 7.66 (dd, 2H), 8.29 (s, 1H) |
| 21 | (4-(CH$_3$CH$_2$OCH$_2$CH$_2$OCH$_2$CH$_2$O)-3-CH$_3$O-C$_6$H$_3$)-CH=N-O-C(=O)-CH$_3$ | 62-63 | 1.21 (t, 3H), 2.22 (s, 3H), 3.53 (q, 2H), 3.61 (m, 2H), 3.73 (m, 2H), 3.91 (s, 3H), 3.93 (t, 2H), 4.24 (t, 2H), 6.92 (d, 1H), 7.11 (dd, 1H), 7.39 (d, 1H), 8.27 (s, 1H) |
| 22 | (4-(CH$_3$C(=O)OCH$_2$CH(CH$_2$-)OCH$_2$CH$_2$O)-3-CH$_3$O-C$_6$H$_3$)-CH=N-O-C(=O)-CH$_3$ | liquid | 2.07 (s, 3H), 2.22 (s, 3H), 3.75-3.85 (m, 2H), 3.85-3.95 (m, 5H), 4.20-4.30 (m, 4H), 6.92 (d, 1H), 7.12 (dd, 1H), 7.39 (d, 1H), 8.28 (s, 1H) |

TABLE 1-continued

| Example | structure | state/mp [° C.] | $^1$H-NMR, δ [ppm] |
|---|---|---|---|
| 23 | (structure) | liquid | 2.01 (s, 6H), 1.99 (m, 2H), 2.74-2.78 (m, 6H), 2.22 (s, 3H), 3.91 (s, 3H), 4.08-4.14 (m, 6H), 6.89 (d, 1H), 7.12 (dd, 1H) 7.38 (d, 1H), 8.27 (s, 1H) |
| 24 | (structure) | liquid | 2.05 (m, 2H), 2.22 (s, 3H), 2.48 (m, 4H), 2.54 (t, 2H), 3.72 (dd, 4H), 3.91 (s, 3H), 4.13 (t, 2H), 6.90 (d, 1H) 7.12 (dd, 1H), 7.39 (d, 1H) 8.27 (s, 1H) |
| 25 | (structure) | 66-69 | 0.88 (t, 3H), 1.20-1.40 (m, 12H), 1.46 (m, 2H), 1.86 (m, 2H), 2.22 (s, 3H), 3.92 (s, 3H), 4.05 (t, 2H), 6.87 (d, 1H) 7.11 (dd, 1H), 7.38 (d, 1H) 8.27 (s, 1H) |
| 26 | (structure) | 71-73 | 0.88 (t, 3H), 1.20-1.50 (m, 18H), 1.86 (m, 2H), 2.22 (s, 3H), 3.92 (s, 3H), 4.05 (t, 2H), 6.87 (d, 1H), 7.12 (d, 1H), 7.38 (d, 1H), 8.27 (s, 1H) |
| 27 | (structure) | 93-95 | 2.21 (s, 3H), 3.85 (s, 6H), 6.44 (s, 1H), 6.52 (dd, 1H), 7.92 (d, 1H), 8.68 (s, 1H) |

TABLE 1-continued

| Example | structure | state/mp [° C.] | $^1$H-NMR, δ [ppm] |
|---------|-----------|-----------------|---------------------|
| 28 | | 114-119 | 2.25 (s, 6H), 7.52 (t, 1H), 7.89 (dd, 2H), 8.06 (dd, 1H), 8.34 (s, 2H) |
| 29 | | liquid | 2.22 (s, 3H), 6.53 (dd, 1H), 6.93 (d, 1H), 7.28 (d, 1H), 8.22 (s, 1H) |
| 30 | | 106-111 | 2.29 (s, 3H), 7.28 (m, 2H), 7.42 (dd, 1H), 7.54 (d, 1H), 8.14 (dd, 1H), 8.54 (s, 1H), 8.67 (br s, 1H) |

The following sensitizers are used in examples 31 and 32:

S-1 a mixture of 2-isoproypthioxanthone and 4-isopropylthioxanthone (QUANTACURE® ITX, provided by International Biosynthetics)

S-2 4,4'-bis(diethylamino)benzophenone (Michler's ketone)

EXAMPLE 31

A photocurable formulation for a sensitivity test is prepared by mixing the following components:
- 200.0 parts by weight of acrylated acrylcopolymer (ACA200M®, provided by Daicel Industries, Ltd., solid content is 50% by weight)
- 15.0 parts by weight of dipentaerythritol hexaacrylate ((DPHA), provided by UCB Chemicals),
- 100.0 parts by weight of acetone To that mixture 0.5% (based on the solid content) of a sensitizer and 2% (based on the solid content) of the initiator to be tested are added and stirred. All operations are carried out under yellow light. The formulations are applied to an aluminum plate. The solvent is removed by heating at 80° C. for 15 minutes in a convection oven. The thickness of the dry film is 25 μm. Onto this coating an acetate film is applied, over which a standardized test negative with 21 steps of different optical density (Stouffer step wedge) is placed. The sample is covered with a second UV-transparent film and pressed onto a metal plate by means of vacuum. Exposure is carried out in a first test series for 40 seconds, in a second series for 80 seconds and in a third series for 160 seconds, using a metal halide lamp (ORC, model SMX 3000) at a distance of 60 cm.

Following exposure, the cover films and the mask are removed and the exposed film is developed with 1% sodium carbonate aqueous solution for 180 sec. at 30° C. by using a spray type developer (Walter Lemmen, model T21). The sensitivity of the initiator system used is characterized by indicating the highest step number which remained (i.e. polymerized) after developing. The higher the number of steps, the more sensitive is the system tested.

The results are collected in table 2.

TABLE 2

| Photoinitiator of example | Sensitizer | Number of steps reproduced after exposure time of | | |
|---|---|---|---|---|
| | | 40 sec. | 80 sec. | 160 sec. |
| 1 | — | 10 | 12 | 14 |
| 1 | S-1 | 11 | 13 | 15 |
| 2 | S-1 | 11 | 13 | 15 |
| 3 | S-1 | 10 | 13 | 14 |
| 4 | S-1 | 9 | 12 | 14 |
| 5 | S-1 | 10 | 12 | 14 |
| 6 | S-1 | 9 | 11 | 13 |
| 7 | S-1 | 8 | 10 | 12 |
| 8 | S-1 | 8 | 10 | 12 |
| 12 | — | 9 | 11 | 13 |
| 12 | S-1 | 11 | 13 | 15 |
| 13 | S-1 | 11 | 13 | 15 |
| 14 | S-1 | 10 | 13 | 14 |
| 15 | S-1 | 10 | 12 | 14 |
| 17 | S-1 | 10 | 12 | 14 |
| 18 | S-1 | 9 | 11 | 13 |
| 19 | S-1 | 9 | 11 | 13 |

TABLE 2-continued

| Photoinitiator of example | Sensitizer | Number of steps reproduced after exposure time of | | |
|---|---|---|---|---|
| | | 40 sec. | 80 sec. | 160 sec. |
| 21 | S-1 | 10 | 12 | 14 |
| 22 | S-1 | 9 | 11 | 13 |
| 23 | S-1 | 9 | 11 | 13 |
| 24 | S-1 | 9 | 11 | 13 |
| 25 | S-1 | 11 | 13 | 15 |
| 26 | S-1 | 10 | 12 | 14 |
| 27 | S-1 | 10 | 13 | 15 |

EXAMPLE 32

Preparation of Poly(benzylmethacrylate-co-methacrylic Acid)

24 g of benzylmethacrylate, 6 g of methacrylic acid and 0.525 g of azobisisobutyronitrile (AIBN) are dissolved in 90 ml of propylene glycol 1-monomethyl ether 2-acetate (PG-MEA). The resulting reaction mixture is placed in a preheated oil bath at 80° C. After stirring for 5 hours at 80° C. under nitrogen, the resulting viscous solution is cooled to room temperature and used without further purification. The solid content is about 25%.

A photocurable composition is prepared by mixing the following components:
- 240.0 parts by weight of copolymer of benzylmethacrylate and methacrylic acid benzylmethacrylate:methacrylic acid=80:20 by weight) 25% propylene glycol 1-monomethyl ether 2-acetate (PGMEA) solution, prepared as described above
- 40.0 parts by weight of dipentaerythritol hexaacrylate ((DPHA), provided by UCB Chemicals),
- 2.0 parts by weight of the photoinitiator,
- 1.2 parts by weight of the sensitizer, and
- 120.0 parts by weight of PGMEA All operations are carried out under yellow light. The compositions are applied to an aluminum plate using an electric applicator with a wire wound bar. The solvent is removed by heating at 100° C. for 2 minutes in a convection oven. The thickness of the dry film is approximately 2 µm. A standardized test negative film with 21 steps of different optical density (Stouffer step wedge) is placed with an air gap of around 100 µm between the film and the resist. Exposure is carried out using a 250 W super high pressure mercury lamp (USHIO, USH-250BY) at a distance of 15 cm. A total exposure dose measured by an optical power meter (ORC UV Light Measure Model UV-M02 with UV-35 detector) on the test negative film is 500 mJ/cm². After exposure, the exposed film is developed with 1% sodium carbonate aqueous solution for 100 sec. at 30° C. by using a spray type developer (Walter Lemmen, model T21). The sensitivity of the initiator system used is characterized by indicating the highest number of the step remaining (i.e. polymerized) after developing. The higher the number of steps, the more sensitive is the system tested. The results are listed in table 3.

TABLE 3

| Photoinitiator of example | Sensitizer | Number of steps reproduced after exposure of 500mJ/cm² |
|---|---|---|
| 1 | — | 10 |
| 1 | S-2 | 12 |
| 2 | S-1 | 10 |
| 2 | S-2 | 12 |
| 3 | S-1 | 10 |
| 3 | S-2 | 11 |
| 4 | S-1 | 9 |
| 4 | S-2 | 11 |
| 5 | S-1 | 10 |
| 5 | S-2 | 13 |
| 6 | S-1 | 9 |
| 6 | S-2 | 11 |
| 10 | S-2 | 10 |
| 11 | S-1 | 9 |
| 11 | S-2 | 11 |
| 12 | S-1 | 10 |
| 12 | S-2 | 10 |
| 13 | S-2 | 10 |
| 15 | S-2 | 9 |
| 16 | S-2 | 9 |
| 17 | S-2 | 9 |
| 18 | S-2 | 10 |
| 19 | S-1 | 9 |
| 19 | S-2 | 9 |
| 20 | S-1 | 9 |
| 20 | S-2 | 10 |
| 21 | S-2 | 10 |
| 23 | S-2 | 10 |
| 24 | S-1 | 9 |
| 24 | S-2 | 10 |
| 25 | S-2 | 9 |
| 26 | S-2 | 9 |
| 27 | S-1 | 10 |
| 27 | S-2 | 11 |
| 28 | S-2 | 9 |
| 30 | S-2 | 10 |

The invention claimed is:

1. Alkaline developable, photosensitive composition comprising
   (A) at least one alkaline soluble binder resin, prepolymer or monomer component;
   (B) at least one compound of formula I or II

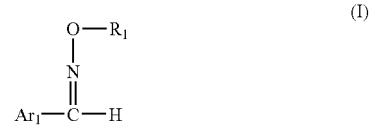

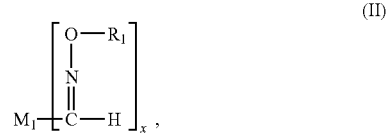

wherein $R_1$ is $C_2$-$C_4$alkanoyl;

$Ar_1$ is phenyl or naphthyl, each of which is substituted by halogen, $C_1$-$C_8$alkyl, $NR_5R_6$ or $OR_3$, wherein the substituents $OR_3$, optionally form 5- or 6-membered rings via the radicals $R_3$ with further substituents on the phenyl or naphthyl ring; or provided that $R_1$ is acetyl, $Ar_1$ is 2-furyl, 2-pyrrolyl, 2-thienyl, 3-indolyl;

$M_1$ is

$x$ is 2;

$R_3$ is $C_1$-$C_{20}$alkyl; or $R_3$ is $C_2$-$C_{12}$alkyl which is substituted by OH, —O(CO)—$C_1$-$C_4$alkyl, —N($C_1$-$C_4$alkyl)$_2$, —N(CH$_2$CH$_2$OH)$_2$, —N[CH$_2$CH$_2$O—(CO)—$C_1$-$C_4$alkyl or morpholinyl; or $R_3$ is $C_2$-$C_{12}$alkyl which is interrupted by one or more —O—; or $R_3$ is —(CH$_2$CH$_2$O)$_{n+1}$H or —(CH$_2$CH$_2$O)$_n$(CO)—$C_1$-$C_4$alkyl;

$n$ is 1 to 3; and $R_5$ and $R_6$ are $C_1$-$C_4$alkyl (C) a photopolymerizable compound and which composition additionally comprises an epoxy compound which contains at least two epoxy groups in the molecule.

2. Photosensitive composition according to claim 1, which additionally to the components (A), (B) and (C) comprises at least one photosensitizer compound (D).

3. Photosensitive composition according to claim 2, comprising 100 parts by weight of component (A), 0.015 to 120 parts by weight of component (B), 5 to 500 parts by weight of component (C) and 0.015 to 120 parts by weight of component (D).

4. Photosensitive composition according to claim 1, comprising further additives (E), which are selected from the group consisting of thermal polymerization inhibitors, inorganic fillers, colourants, epoxy curing agents, amines, chain transfer agents, thermal radical initiators, photoreducable dyes, optical brighteners, thickeners, antifoaming agents and leveling agents.

5. Solder resist comprising a composition according to claim 1.

6. Color filter resist comprising a composition according to claim 1.

7. Process for the photopolymerization of compounds containing ethylenically unsaturated double bonds, which comprises irradiating a composition according to claim 1 with electromagnetic radiation in the range from 150 to 600 nm.

8. Coated substrate which is coated on at least one surface with a composition according to claim 1.

9. Process for forming images, wherein the coated substrate according to claim 8 is patternwise exposed to irradiation, and then developed with aqueous alkaline solution to remove uncured areas followed by thermal curing.

10. Photosensitive composition according to claim 1, wherein compound (A) is an oligomeric or polymeric compound.

11. Photosensitive composition according to claim 1, wherein the photopolymerizable compound (C) is a liquid.

* * * * *